(12) United States Patent
DeSimone et al.

(10) Patent No.: US 12,056,420 B1
(45) Date of Patent: Aug. 6, 2024

(54) METHODS AND SYSTEMS FOR IDENTIFYING, FILTERING AND CLASSIFYING CONTACT-PAIRS

(71) Applicant: ANSYS, Inc., Canonsburg, PA (US)

(72) Inventors: Frank Edward DeSimone, Bolton, MA (US); Glyn Russell Jarvis, Surrey (GB); Andrey Illich Sarkanich, West Newton, MA (US); Sanjaykumar Ranganayakulu, Canonsburg, PA (US); Christopher Michael Maslin, West Sussex (GB)

(73) Assignee: ANSYS, INC., Canonsbrug, PA (US)

( * ) Notice: Subject to any disclaimer, the term of this patent is extended or adjusted under 35 U.S.C. 154(b) by 665 days.

(21) Appl. No.: 17/176,550

(22) Filed: Feb. 16, 2021

Related U.S. Application Data

(60) Provisional application No. 63/048,515, filed on Jul. 6, 2020.

(51) Int. Cl.
| | |
|---|---|
| *G06F 30/12* | (2020.01) |
| *G06F 3/0482* | (2013.01) |
| *G06F 18/2413* | (2023.01) |
| *G06T 19/20* | (2011.01) |

(52) U.S. Cl.
CPC ........... *G06F 30/12* (2020.01); *G06F 3/0482* (2013.01); *G06F 18/24147* (2023.01); *G06T 19/20* (2013.01); *G06T 2210/21* (2013.01); *G06T 2219/2008* (2013.01)

(58) Field of Classification Search
CPC ............... G06F 18/24147; G06F 30/12; G06T 2219/2008; G06T 2210/21; G06T 19/20
See application file for complete search history.

(56) References Cited

U.S. PATENT DOCUMENTS

| | | | | |
|---|---|---|---|---|
| 5,870,094 | A * | 2/1999 | Deering | G06T 9/001 708/203 |
| 11,734,469 | B2 * | 8/2023 | Messervy | G06F 30/13 703/1 |
| 2007/0097125 | A1 * | 5/2007 | Xie | G06T 13/40 345/473 |
| 2008/0243456 | A1 * | 10/2008 | Hudetz | G06F 30/17 703/7 |
| 2011/0238446 | A1 * | 9/2011 | Chaudhry | G16H 10/60 705/3 |
| 2020/0375610 | A1 * | 12/2020 | Wilkinson | A61B 34/10 |

* cited by examiner

*Primary Examiner* — Andrea C Leggett

(57) ABSTRACT

A model (e.g., mechanical computer-aided design (MCAD) model) representing an assembly is displayed in a graphical user interface (GUI). The assembly contains at least a first body and a second body. The physics type of the model is determined in response to an assignment of a physics condition to the first body and/or the second body. Contact-pairs are detected in the model according to the determined physics type. The GUI is updated to indicate where the contact-pairs are located in the model for revision of the contact-pairs. Markers are shown in the GUI to represent corresponding contact-pairs. Markers are logically separated from bodies and faces in the model. The revision of the contact-pairs can be managed with a filtering mechanism either by bodies/faces or by markers.

10 Claims, 22 Drawing Sheets

METHODS AND SYSTEMS FOR IDENTIFYING, FILTERING AND CLASSIFYING CONTACT-PAIRS

CROSS-REFERENCE TO RELATED APPLICATIONS

This application claims benefits of U.S. Provisional Patent Application Ser. No. 63/048,515 for "Method And System For Identifying, Filtering and Classifying Contact Pairs", filed Jul. 6, 2020. The contents of which are hereby incorporated by reference in its entirety for all purposes.

FIELD

The subject matter described herein relates to computer-aided engineering design and analysis, more particularly to methods and systems for identifying, filtering and classifying contact-pairs and/or interfaces in a computerized model, for example, a mechanical computer-aided design (MCAD) model.

BACKGROUND

MCAD software is used to create and modify two- and three-dimensional geometry, in order to design, assess and document mechanical and sheet metal components, assemblies, and products. In the development process, MCAD software can be used to: a) explore different iterations of a design, either conceptually or in detail, such that users can build out different alternatives and options, comparing them to each other; b) assess the form and fit of designs; and c) generate engineering documentation, and in more advanced cases d) use finite element analyses to virtually and non-destructively test the material, load case, and structural/thermal/fluid/electrical physics involved in the design. Any analysis and documentation is released to manufacturing as part of the specifications used to source, fabricate and produce products. MCAD software provides many capabilities including, but not limited to, three-dimensional modeling (e.g., history-based modeling, direct geometry modeling), engineering documentation (e.g., drafting, model-based definitions, derived drawing creation), two-dimensional sketching, assembly modeling, and the analyses of many and varied physics.

Contacts between two or more independent bodies can be analyzed in a numerical simulation of bodies touching each other at one or more locations. Before performing such a simulation, a list of geometry-based pairs of potential contacts needs to be created for user's manual refinement. However, these prior art approaches have been repetitive, time-intensive, and error-prone.

SUMMARY

In one aspect of the disclosure, a model representing an assembly is displayed in a graphical user interface (GUI). The assembly contains at least a first body and a second body. The physics type of the first body and/or the second body is determined in response to an assignment of a physics condition to the first body and/or the second body. Contact-pairs are detected in the model according to the determined physics type. The GUI is updated to indicate where the contact-pairs are located in the model for revision of the contact-pairs. Markers are shown in the GUI to represent corresponding contact-pairs. Markers are logically separated from bodies and faces in the model. The revision of the contact-pairs can be managed with a filtering mechanism either by bodies/faces or by markers. The model can be a computerized model, for example, a mechanical computer-aided design (MCAD) model. Each body can contain either solid or fluid material. The bodies can be boundary representation (B-rep) bodies. Each B-rep body may be formed by one or more B-rep faces.

In another aspect, a user command can comprise assigning a physics condition (e.g., boundary condition, load case, feature) in the model. The physics condition can be a "Structural" condition (e.g., displacement, fixed support, force, etc.), which implies/indicates the physics type may be related to structural characteristics of a physical object. Another example physics condition can be a "Fluid Flow" condition, or a "Solid Thermal" condition.

In yet another aspect, adjacent tangent faces can be grouped together as one or the other side of a contact-pair, preventing trivial pairings from being created needlessly, which would complicate the pair review.

In yet another aspect, a contact-pair can be entirely converted to a joint via a user review and revision. In a simpler case, the contact-pair type (bonded or sliding, if sliding then frictionless or by a coefficient, etc.) can be changed via a user review and revision. In still another aspect, not yet reviewed but default contact-pairs are automatically detected/identified upon determination of physics type, or modification of the model.

In still another aspect, the contact classification breadth can also be changed, from one marker per body-to-body contact, to one marker to each face in contact between bodies, or to one marker per group of tangent faces in contact with other bodies.

In still another aspect, the contact detection behaviors can be tracked in the tool due to model changes, additions and subtractions, etc. For example, the tool tracks what is first filtered, then selected, and also what is detected after more model changes.

In additional to contact between solid bodies, the disclosed mechanism can detect contacts between fluid body and solid body, or between fluid body and fluid body. Contact-pairs referred to as interfaces (when both solid body and fluid body are modelled) are assigned when contact is detected between fluid body and solid body, or between fluid body and fluid body. The interface (similar to the solid-to-solid contact-pair) types can be reviewed and revised as required.

Further, the disclosed mechanism allows a user to review the locations where the default physics condition has been applied and offers the ability for the user to change the default physics condition.

Examples of the aforementioned situations are:

Walls (when only the fluid bodies are modelled, and the solid bodies forming a wall are not modelled). Further, when the fluid body is connected to another virtual fluid, and it defines the boundary of the simulation.

Heat transfer (when a solid body is connected to another body that is not modelled), and heat is lost to the touching fluid body or solid body. The surrounding is assumed to be a fluid (e.g., air) and thus convection is the default heat transfer method.

In still another aspect, the contact detection uses the material assigned to the body to categorize the contact-pair type as "Contact" for solid-to-solid contact-pairs, or "Fluid Structure Interface" for solid-to-fluid interface, or "Fluid Interfaces" for fluid-to-fluid interface.

Non-transitory computer-readable medium (i.e., physically embodied computer program products) is described that stores instructions, which when executed by one or more data processors of one or more computing systems, cause at least one data processor to perform operations herein. Similarly, computer systems are described that may include one or more data processors and memory coupled to the one or more data processors. The memory may temporarily or permanently store instructions that cause at least one processor to perform one or more of the operations described herein. In addition, methods can be implemented by one or more data processors either within a single computing system or distributed among two or more computing systems. Such computing systems can be connected and can exchange data and/or commands or other instructions or the like via one or more connections, including but not limited to a connection over a network (e.g., the Internet, a wireless wide area network, a local area network, a wide area network, a wired network, or the like), via a direct connection between one or more of the multiple computing systems, etc.

Any combination of one or more computer-readable storage medium(s) may be utilized. A computer-readable storage medium may be embodied as, for example, an electronic, magnetic, optical, electromagnetic, infrared, or semiconductor system, apparatus, or device, or other like storage devices known to those of ordinary skill in the art, or any suitable combination of computer-readable storage mediums described herein. In the context of this document, a computer-readable storage medium may be any tangible medium that can contain, or store a program and/or data for use by or in connection with an instruction execution system, apparatus, or device. Even if the data in the computer-readable storage medium requires action to maintain the storage of data, such as in a traditional semiconductor-based dynamic random access memory, the data storage in a computer-readable storage medium can be considered to be non-transitory. A computer data transmission medium, such as a transmission line, a coaxial cable, a radio-frequency carrier, and the like, may also be able to store data, although any data storage in a data transmission medium can be said to be transitory storage. Nonetheless, a computer-readable storage medium, as the term is used herein, does not include a computer data transmission medium.

The details of one or more variations of the subject matter described herein are set forth in the accompanying drawings and the description below. Other features and advantages of the subject matter described herein will be apparent from the description and drawings, and from the claims.

DETAILED DESCRIPTION

Methods and systems for identifying, filtering and classifying contact-pairs and or interfaces are disclosed. In a mechanical computer-aided design (MCAD) system, contact-pairs and/or interfaces can be automatically detected between bodies in MCAD assemblies. Then the contact-pairs/interfaces can be reviewed with a graphical user interface (GUI) based software tool having the following capabilities: to show the current set of contact-pairs/interfaces, as assumed; to allow the user to further change the behaviors and contact types; to see these manually-overridden contacts in a compact type-based list for tracking purposes; and to allow later changes to be made. This feature allows for simultaneous review, filtering, conversion, and scope and detailed property adjustments to be made in the same tool.

In mechanical art, contact is defined as two bodies touching each other at one or more points. Touching can be defined as within some defined small distance (i.e., some proximity). A contact-pair is a pair of solid bodies that are in a contact with each other. When one of the two bodies contains fluid material, the contact-pair is referred to as an interface between two bodies. Therefore, terms "contact-pair" and "interface" are interchangeably used in this document.

A GUI (graphical user interface) is a system of interactive visual components for computer software. A GUI displays objects conveying information and representing actions that can be taken by the user. The objects change color, size, or visibility when the user interacts with them. GUI objects include icons, cursors, and buttons, as well as geometry objects that include faces, edges, and vertices. These graphical and geometry elements are sometimes enhanced with sounds, or visual effects like transparency and drop shadows. User interface elements are those elements used by graphical user interfaces (GUIs) to offer a consistent visual language to represent information stored in computers.

Figure 9A:
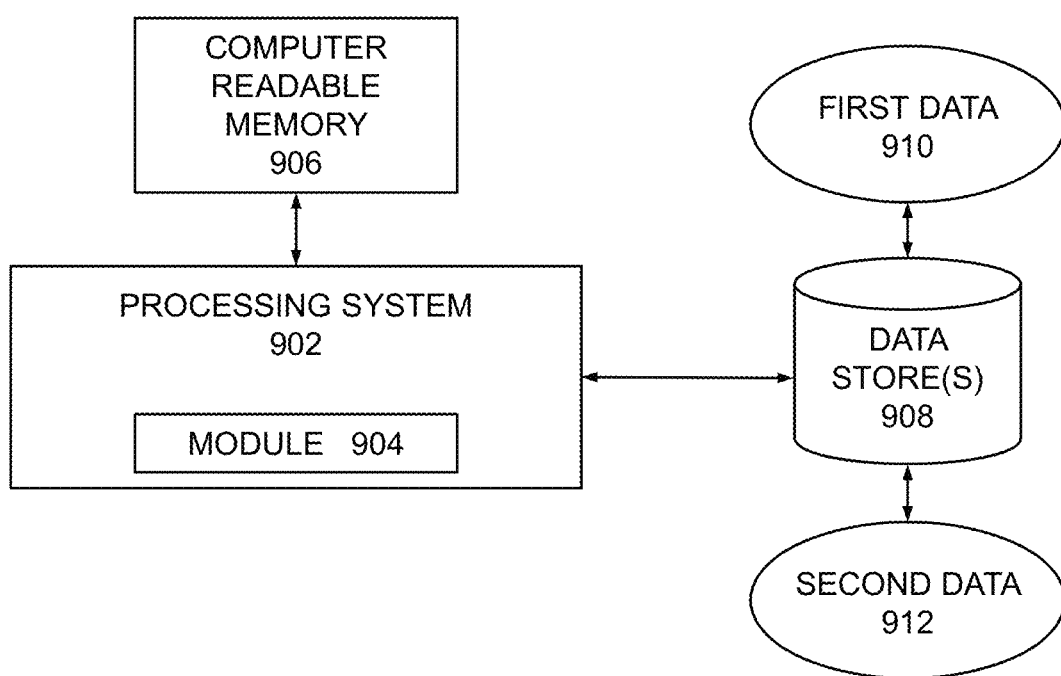
FIG. 9A is a block diagram showing an example system including a standalone computing architecture.
Figure 9B:
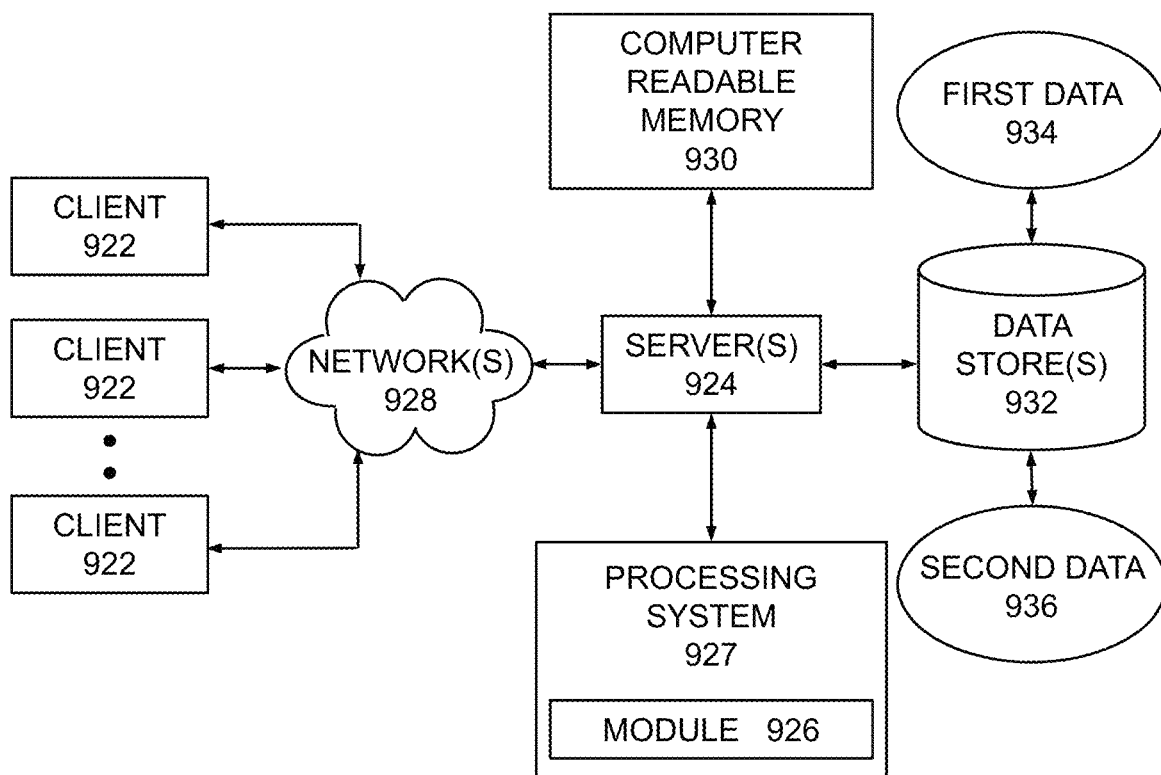
FIG. 9B is a block diagram showing an example system including a client-server computing architecture.

The tool can be a pre-processor operating on one or more data processors (e.g., computer systems shown in FIGS. 9A-9B). The tool is configured to access a computerized model (e.g., MCAD model) to generate pixel data based on a user-changeable point of view. Upon receiving a first user input through a user interface manipulation to the computerized model data, and/or characteristics of the computerized model (e.g., physics conditions, material properties), contact-pairs/interfaces are detected and displayed as a set of markers/indicators (e.g., selectable dots) on the graphical user interface by the tool. The tool is further configured to receive a second user input for selection of a portion of the markers for review and revision by the user.

Some terms used in this document are defined as follows:

MCAD model contains user-understood objects. These Geometry objects can be created by the user, or automatically created by the MCAD system. Each object is associated with one or more attributes which can be controlled (e.g., assigned, changed, altered) by the user. Examples of attributes are color, value, position, state, etc.

In the tool, a component contains one or more B-rep bodies. Components can be arranged into assemblies. An assembly is also a component. Each component can have physics attributes (e.g., physics conditions, material types, etc.).

Any B-rep body can contain faces, edges and vertices, also known as geometry objects. Under B-rep mathematics, faces are bounded by edges and neighboring faces share edges. Edges meet at vertices. A collection of faces that are touching make a surface. A closed (watertight, or having a defined inside and outside) surface is called a solid. Both solids (closed) and surfaces (open) are B-rep bodies. Additionally, a face is a mathematical construction (of the underlying UV-defined surface under MCAD) that is bounded by edges, which is what is seen as a "face" on the screen.

According to a first embodiment, the disclosed mechanism can perform operations including the following steps:

Step 1: In response to receiving a change of geometry (e.g., a geometry entry into the physics-definition stage), the disclosed mechanism (e.g., a GUI based software tool for identifying, filtering and classifying contact-pairs, hereinafter referred to as "the tool") invokes a contact detection algorithm to detect or identify contact-pairs and/or interfaces once the physics type of the model (e.g., bodies in an assembly) has been determined. A set of possible physics types can be configured or defined to classify an MCAD model or portions of the model (e.g., one or more bodies). Examples of possible physics types may be related to physics characteristics such as structural, fluid, structural-thermal, solid-thermal, fluid-thermal, fluid-solid heat transfer, fluid-solid force transfer, fluid structure interaction (FSI), conjugate heat transfer (CHT), etc. Used in this document, terms "FSP" and "fluid-solid force transfer" are interchangeable, and terms "CHT" and "fluid-solid heat transfer" are interchangeable.

Step 2: The disclosed mechanism classifies each detected or identified contact-pair (by some proximity parameter, for example, within certain distance) into one of many possible contact types, such as a bonded type (default type), a sliding type, a free or excluded type, or other applicable types.

Step 3: The disclosed mechanism presents/shows all bodies in the assembly in a graphical user interface (GUI). Contact-pairs among the bodies are explicitly presented with markers on the assembly to facilitate user selection by a clear separation between markers and B-rep bodies/faces in the GUI. Markers are used for representing respective contact-pairs and/or interfaces in the GUI.

Step 4: The disclosed mechanism filters the bodies and resultant contact-pairs/interfaces (which is the basic function of the tool) to update display in the GUI to assist with user review. In one embodiment, the updated display provides easy, focused and flexible access to all the filtered bodies. For example, only contact-pairs/interfaces on shown bodies in the display are presented or shown in the GUI. If no contact-pair/interface is explicitly selected as indicated by the markers in the GUI, then all the contact-pairs/interfaces associated with the current filter set may be selected for possible conversion (e.g., if none are selected, then all are assumed as default). Filter faces and/or bodies are used for including objects in the MCAD model such that contact-pairs/interfaces associated with the selected objects can be reviewed and revised.

Step 5: In response to user instructions received (e.g., during user review), the disclosed mechanism can change or update the contact type of the selected one or more contact-pairs (or all by filter, as noted above) to other types of contact (e.g., bonded, sliding, free, or turned entirely to joints).

Step 6: Optionally, the contact detection algorithm as disclosed may be customizable with configuration settings including a contact classification breadth. For example, the contact classification breadth can be changed, from one marker per body-to-body connection, to one marker to each face in contact between bodies, or to one marker per tangent group of faces in contact with other bodies.

Step 7: Optionally, contact detection run behaviors (to handle model changes, additions, and subtractions) of the tool can be specified/updated. As such, the tool can be invoked sequentially with different behaviors to handle what is first filtered, then selected, and also what is detected after more model changes.

Steps 1-7 of the first embodiment are demonstrated in FIGS. 1A-1K along with corresponding descriptions below.

Figure 1A:
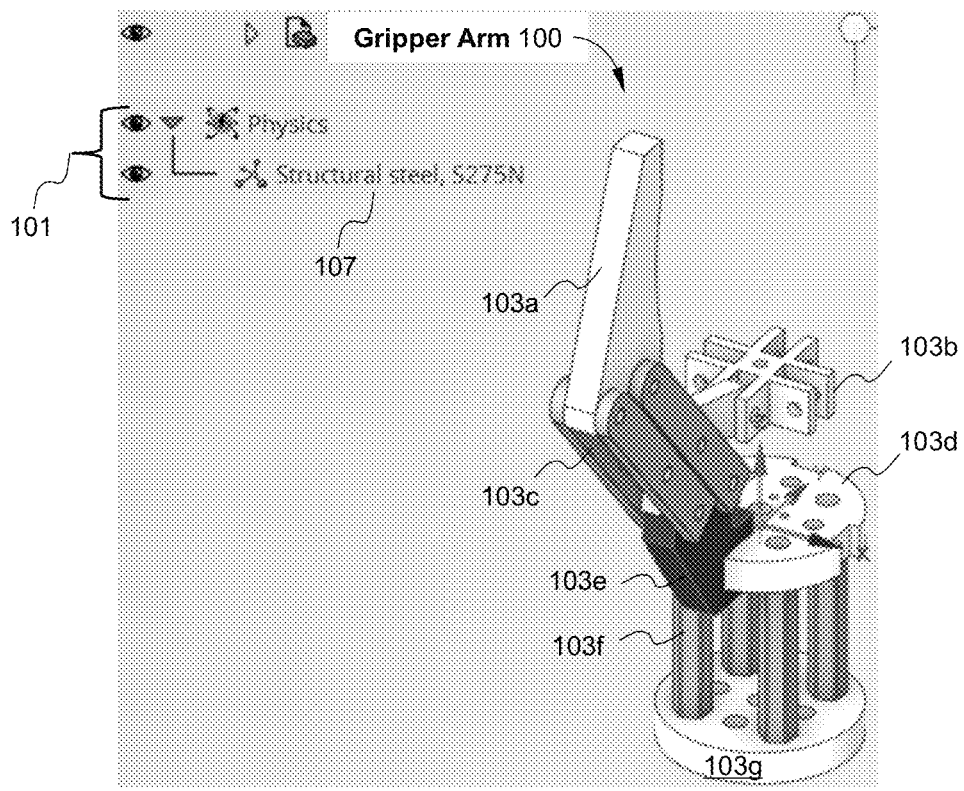
FIGS. 1A-1K are diagrams illustrating a series of displays in a graphical user interface (GUI) for identifying, filtering and classifying contact-pairs in a mechanical computer-aided design (MCAD) model.
Figure 1B:
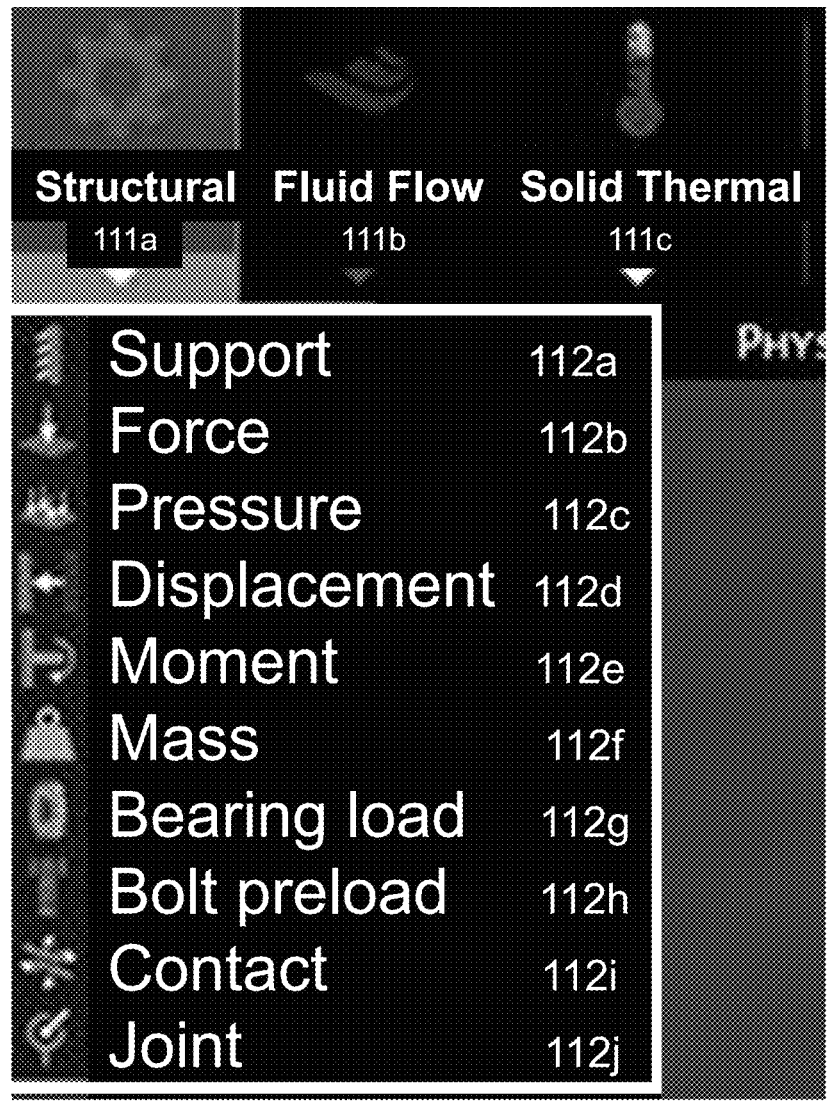

FIG. 1A shows the initial state of an assembly 100 (i.e., "Gripper Arm") in a GUI upon a user instruction (e.g., loading it from a storage subsystem in a computer). The assembly 100 contains many components 103a-103g (e.g., B-rep bodies). At this moment, there is no physics type defined. As shown in "Physics" tree 101, only default material type ("Structural steel, S275N" 107) is assigned to the components or bodies 103a-103g.

A user can then assign a physics condition to any of the bodies. The physics condition can indicate a boundary condition applied to a model of an assembly 100. For example, physics conditions may specify load, displacement, force, physics state (e.g., temperature), or other applicable physics constraints, imposed on a portion or location of the model. In an example shown in FIG. 1B, a group of possible physics conditions (i.e., "Structural" 111a, "Fluid Flow" 111b, "Solid Thermal", 111c) are presented in the GUI for the user to select. As the user clicks "Structural" 111a, an expanded menu of various possible physics conditions is presented, for example, "Support" 112a, "Force" 112b, "Pressure" 112c, "Displacement" 112d, "Moment" 112e, "Mass" 112f, "Bearing load" 112g, "Bolt preload"112h, "Contact" 112i and "Joint" 112j.

Figure 1C:
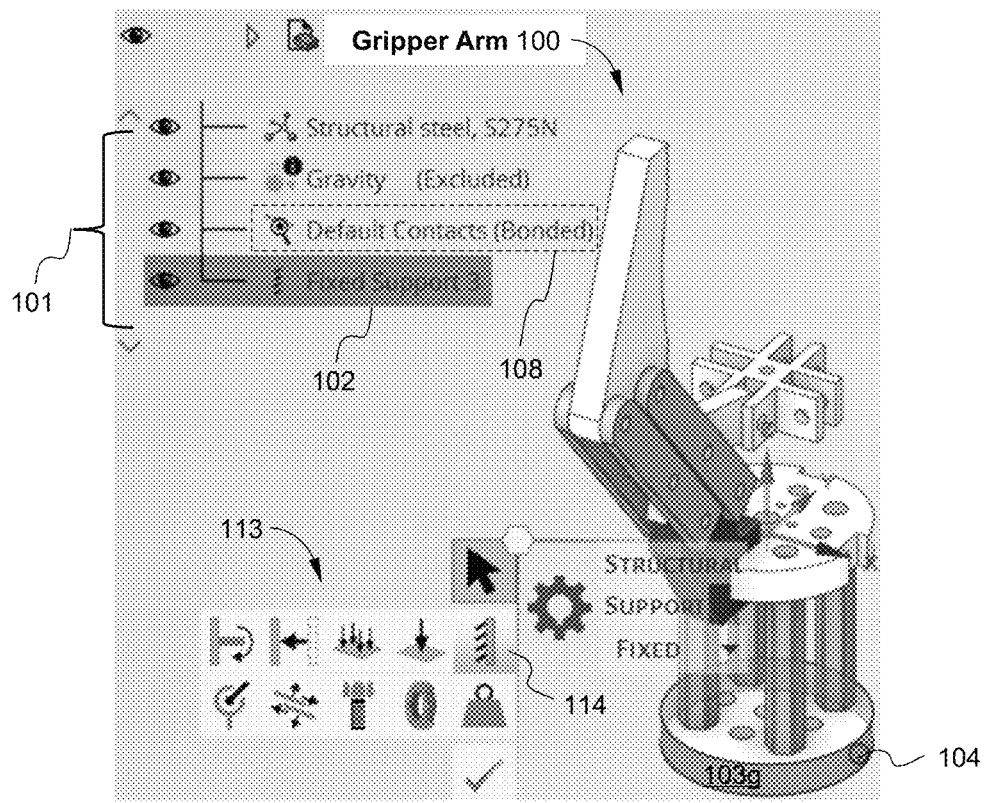
Figure 1D:
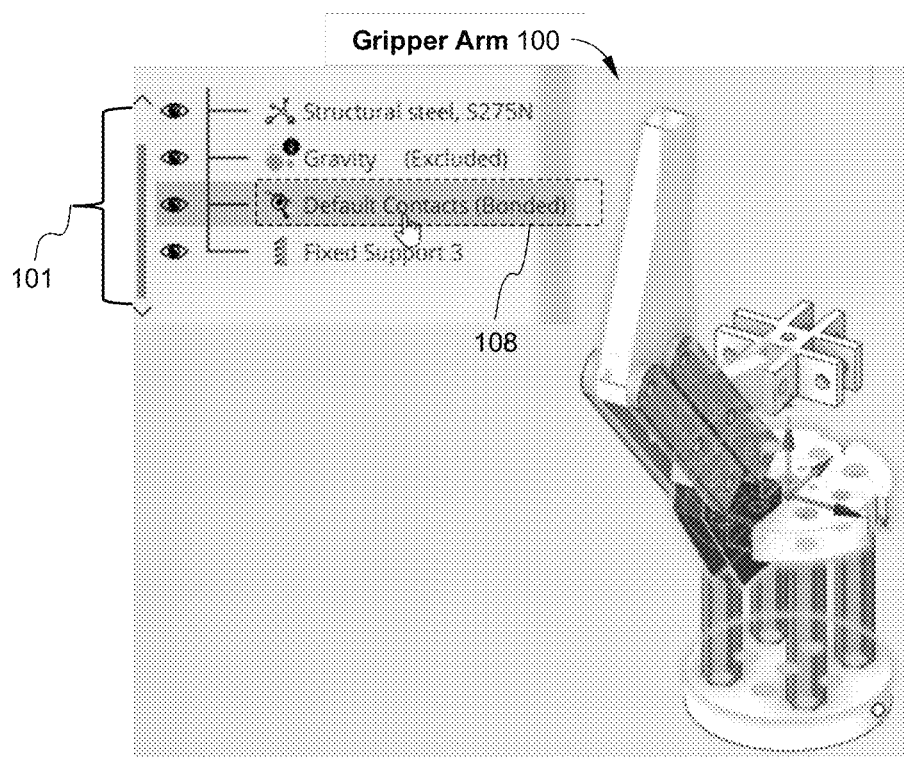

After the tool receives the user command of assigning a fixed support to a body (i.e., component or base body 103g), it implies/indicates that the physics type in the model may be "structural" or related to mechanical structural relationships. A contact detection algorithm is automatically invoked (Step 2) upon the determination of physics type. FIG. 1C shows the definition of a structural support (highlighted as "Fixed Support 3" 102 in the tree 101 and in the base body 103g indicated by an indicator 104), and automatic appearance of the option "Default Contacts (Bonded)" 108 in "Physics" tree 101 (i.e., a set of options for user review) as a clickable object or a user interface element. A graphical menu 113 of different structural conditions is shown as respective icons (i.e., the same set of user interface elements 112a-112j in the expanded menu shown in FIG. 1B). In this example, the structural support (i.e., the highlighted item 114 in the graphical menu 113) is assigned to the base body 103g. FIG. 1D is a mouse-over "Default Contact (Bonded)" 108 preview of all the faces that have been detected in contact.

Figure 1E:
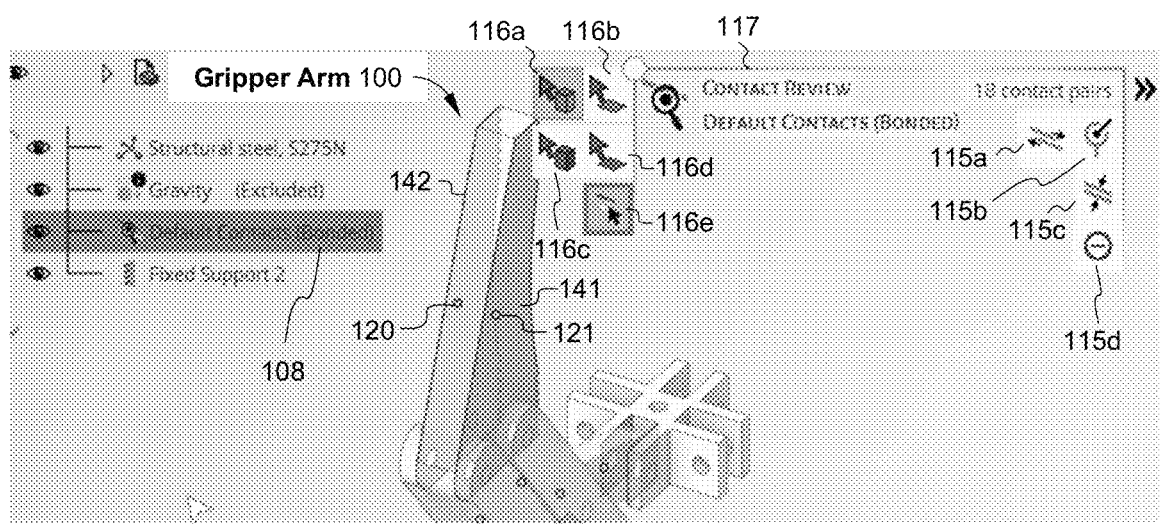
Figure 1F:
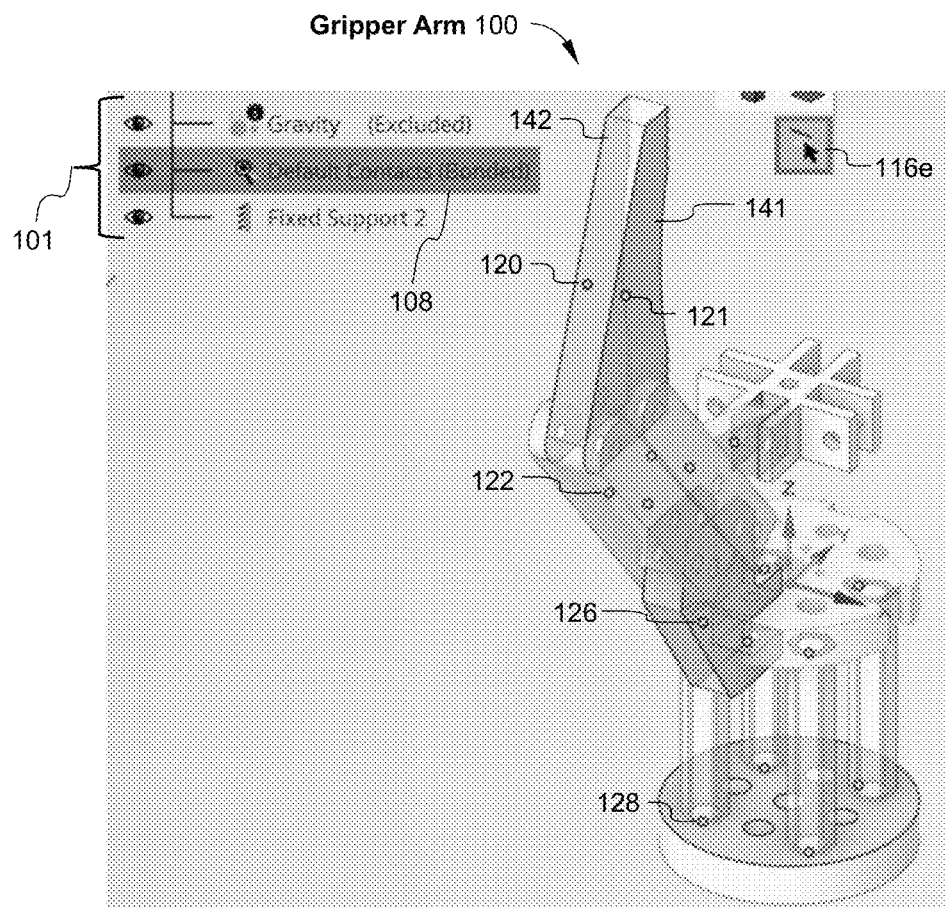

FIG. 1E shows the selected object representing all the detected contact-pairs, and the initial view of the tool unfiltered by bodies or faces (Step 3). When a filter is not explicitly defined, all bodies in the assembly are included as default. FIG. 1E also shows both bodies and contact-pairs as selection ready (Step 4). Filtered bodies can be selected either by body (e.g., top body 103a) or by face (e.g., front and back faces 141, 142 of top body 103a). Contact-pairs can be selected by marker (e.g., markers 120, 121). In the contact review pane 117, "CONTACT REVIEW", the total number of detected contact-pairs is shown (e.g., "18 contact-pairs" are detected in this example, not all of them shown). Default contact type is bonded. FIG. 1F shows another view of all involved faces and corresponding contact-pairs as markers (Step 4). A few example markers (selectable dots) 120, 121, 122, 126, 128 are shown. For illustration simplicity and clarity, other markers are not labeled or shown. In one embodiment, original body colors are desaturated to ease this visual cue.

Icons shown on the right side of the contact review pane 117 are choices or user interface elements as follows:
  "Convert to sliding" 115a;
  "Convert to joints" 115b;
  "Convert to permanently bonded" 115c; and
  "Excluded from contact detection" 115d.

In the left side of the contact review pane 117, there are five icons for user to select (i.e., user interface elements) for review and revision. The choices are:
  "Select a body for which you want to review all contact pairs (primary body)" 116a;
  "Select a face for which you want to review all contact pairs (primary face)" 116b;
  "Select a secondary body to review only contact between the secondary body and any primary body (Alt-click)" 116c;
  "Select a secondary face to review only contact between the secondary face and any primary face (Alt-click)" 116d; and
  "Select markers for individual contact pairs to be converted" 116e.

The "Select Markers" icon 116e is always on and shows that regardless of what is happening with filtering by bodies or faces, primary or secondary. The user can always select markers (which represent any particular contact-pair) showing that the tool provides both the filtering and selection simultaneously.

Figure 1G:
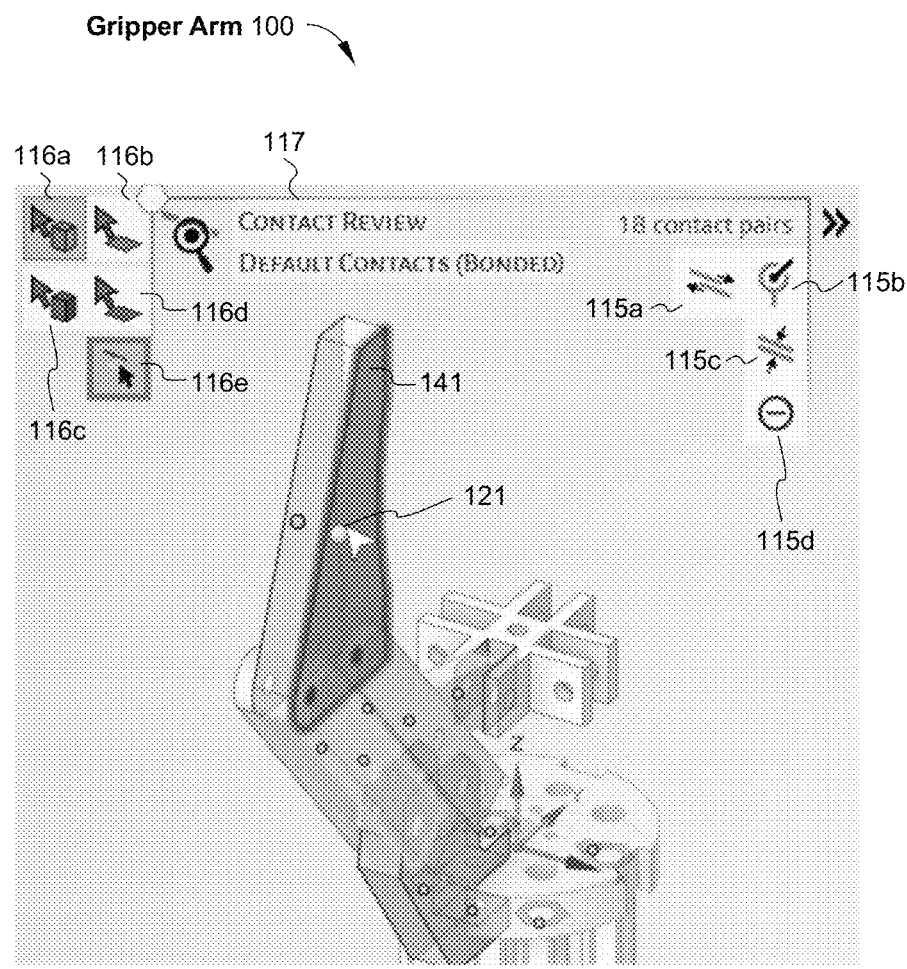
Figure 1H:
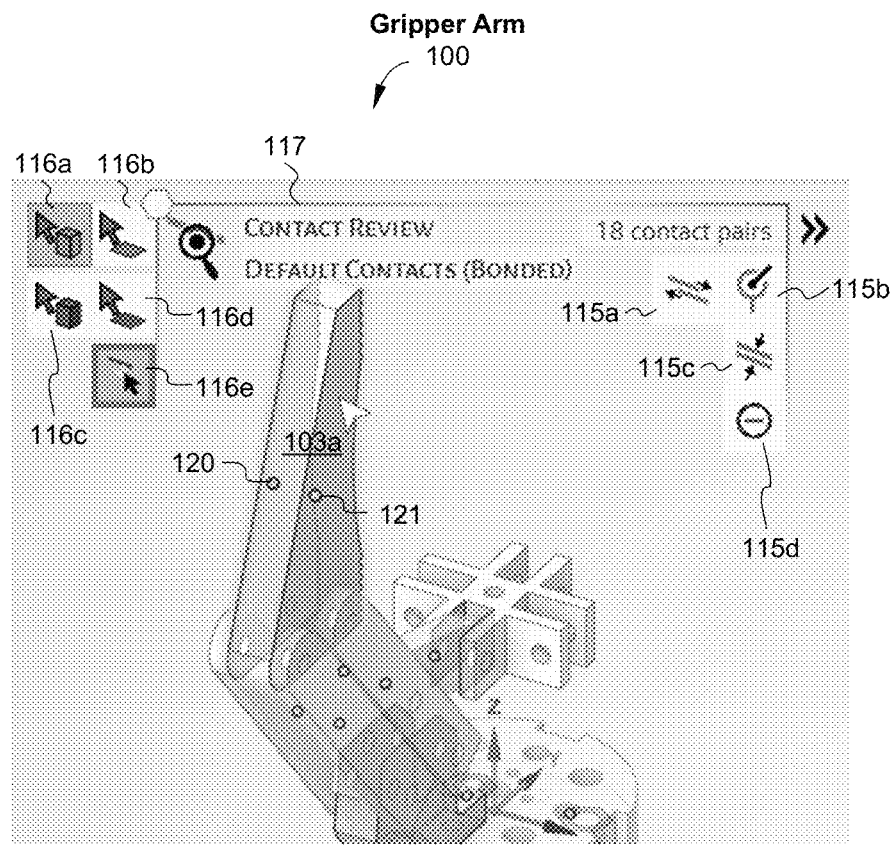

FIG. 1G shows a pre-selection (e.g., cursor hover) of a particular marker 121 (i.e., an individual contact-pair) and color intensification of the involved face 141 for that marker 121 to make certain that this is the intended contact-pair for selection/review (Step 4). In this example, all contact-pairs have been initially detected (i.e., selected by default). FIG. 1H shows a pre-selection of the top body 103a (along with glow-highlighting) to ensure that this is the correct body (Step 4) filtering contact-pairs (i.e., markers 120, 121) to only those touching the top body 103a.

Figure 1I:
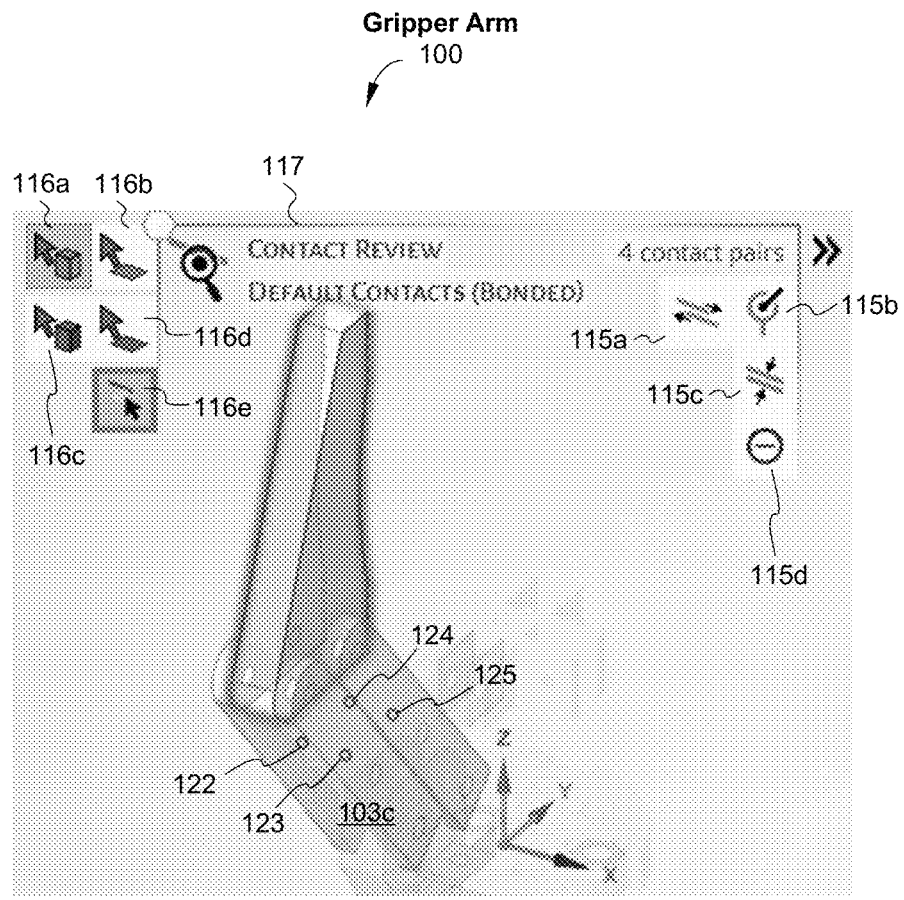

FIG. 1I shows the selection of a body 103c (along with different all-around glow-highlighting) and the resultant (on-selection) filtering-in of contact-pairs (i.e., markers 122, 123, 124, 125). Note the number of contact-pairs changes from 18 to 4 in this example. Additionally, the further fade of the filtered-out bodies (not entirely blanked, though) gives the user some idea of surrounding contacts and also continues through repeated Step 4. Markers associated with filtered-out bodies entirely disappear from the GUI.

Figure 1J:
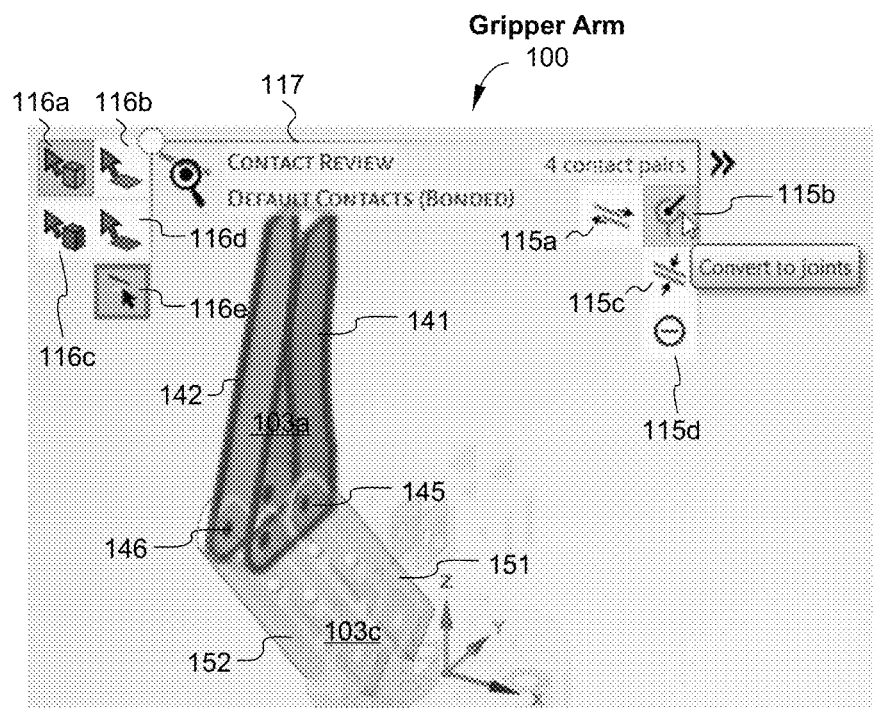

Furthermore, a contact-pair between two bodies 103a, 103c may be a joint. FIG. 1J shows intensification of faces 141, 142, 151, 152 involved in a selected contact-pair about to be converted to another type with provided buttons 115a-115d (Step 5). Conversion results in removal from the list of default contact-pairs reviewable in this tool, and simultaneous addition of a new specific joint object group in the tree. As an example, contact-pairs between the top body 103a and body 103c are converted to joints 145-146 (i.e., the top body 103a and the lower body 103c can rotate against each other about the joints 145, 146) via the "Convert to joints" icon 115b.

Figure 1K:
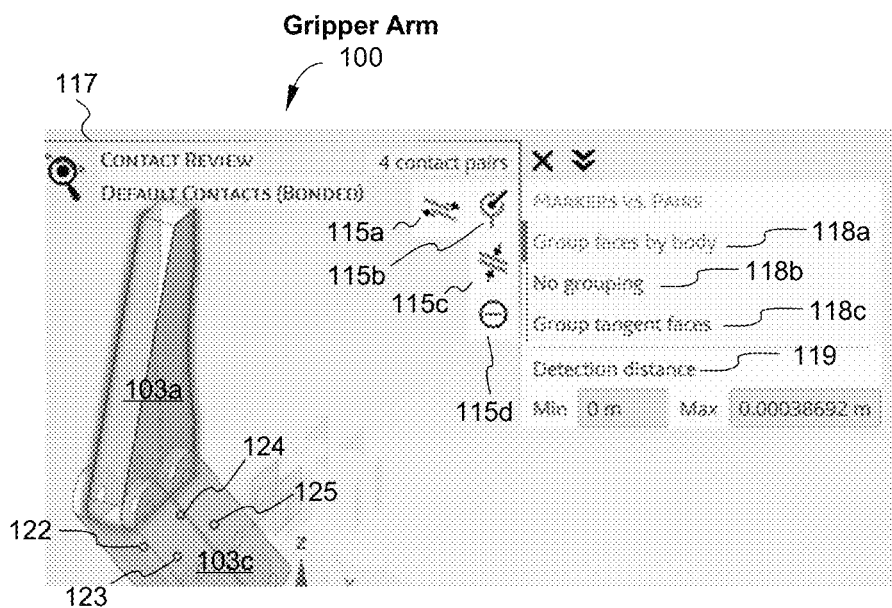

Grouping function allows the markers (i.e., contact-pairs) to represent different logical objects. FIG. 1K shows the breadth of classification (Step 6). Markers as selectable dots can represent one dot per body contact, one dot per face-to-body contact, or one dot per tangent-connected-faces-to-body contact. For example, when a body 103c is selected (i.e., filtered-in), only 4 contact-pairs 122, 123, 124, 125 in body 103c are shown. On the right side of the GUI, it shows that the current grouping is "Group faces by body" 118a under "MARKERS vs. PAIRS". Other choices are "No grouping" 118b, "Group tangent faces" 118c. Furthermore, proximity parameter for detection contact can be a distance range shown as "Detection Distance" 119 with Min. of 0 m and Max. of 0.00038692 m in this example.

Figure 2:
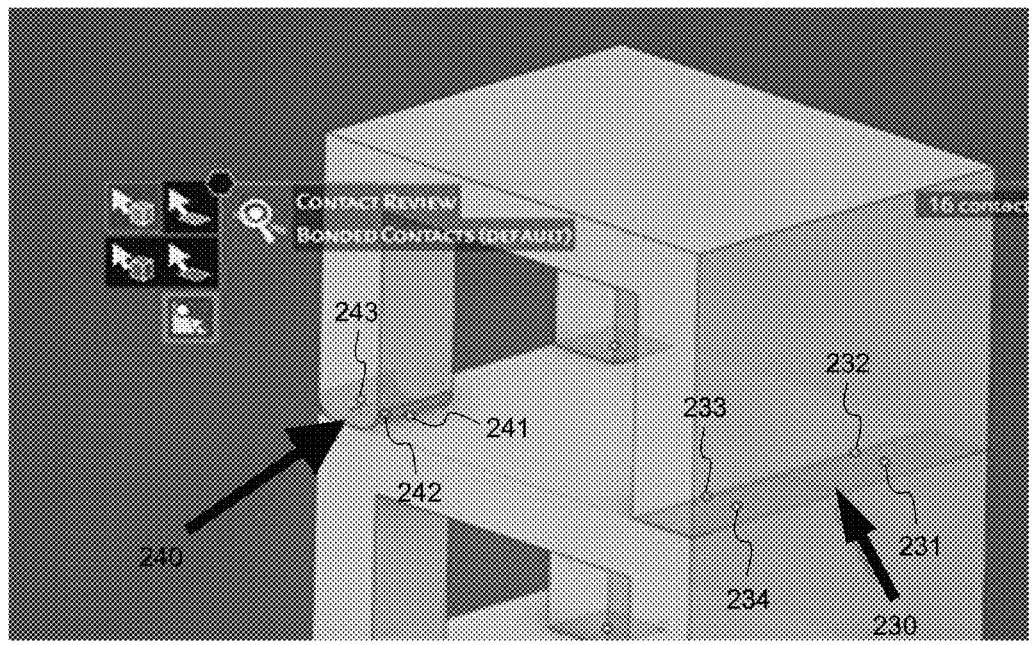
FIG. 2 is a display in a graphical user interface showing example tangent faces.

One method to reduce the number of contact-pairs is to logically (but not actually) merge tangent faces or tangent-connected-faces. Tangent faces are neighboring faces having no measurable angle at the edge between them. Such an example is shown in FIG. 2. Four co-planar faces 231-234 are tangent faces and can be combined into one contact-pair 230. The example contains another contact-pair 240 representing combination of three faces 241-243. Two outside faces 241 and 242 are not coplanar with the center face 242 due to rounded outside edges. However, the edge between faces 241 and 242 has no measurable angle on either side, so does the edge between faces 242 and 243. Such a group of tangent faces can be combined into one contact-pair.

Figure 3:
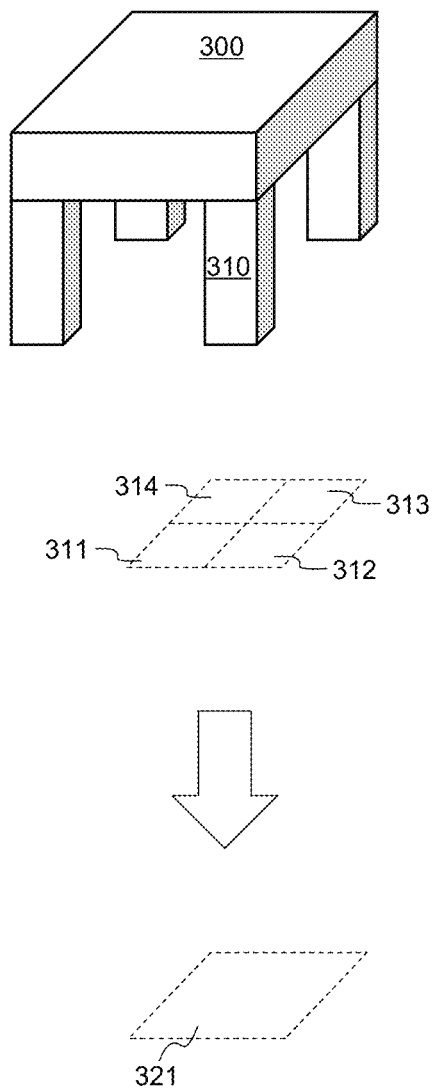
FIG. 3 is a diagram illustrating another example of logically merging tangent faces.

FIG. 3 shows another example of logically merging tangent faces. The bottom of leg 310 of a stool 300 contains four faces 311-314. The four faces 311-314 are coplanar hence tangent faces. Only one contact-pair is created by merging four faces 311-314 to one face 321. This can be performed automatically in the tool, while contact-pairs are detected/determined.

In solid modeling and computer-aided design, boundary representation (often abbreviated as B-rep or BREP) is a method for representing shapes using the limits. A solid or body is represented as a collection of connected surface elements, the boundary between solid and non-solid, or body and non-body. Boundary representation of models are composed of two parts: topology and geometry (surfaces, curves and points). The main topological items are: faces, edges and vertices. A face is a bounded portion of a surface; an edge is a bounded piece of a curve; and a vertex lies at a point.

Figure 4:
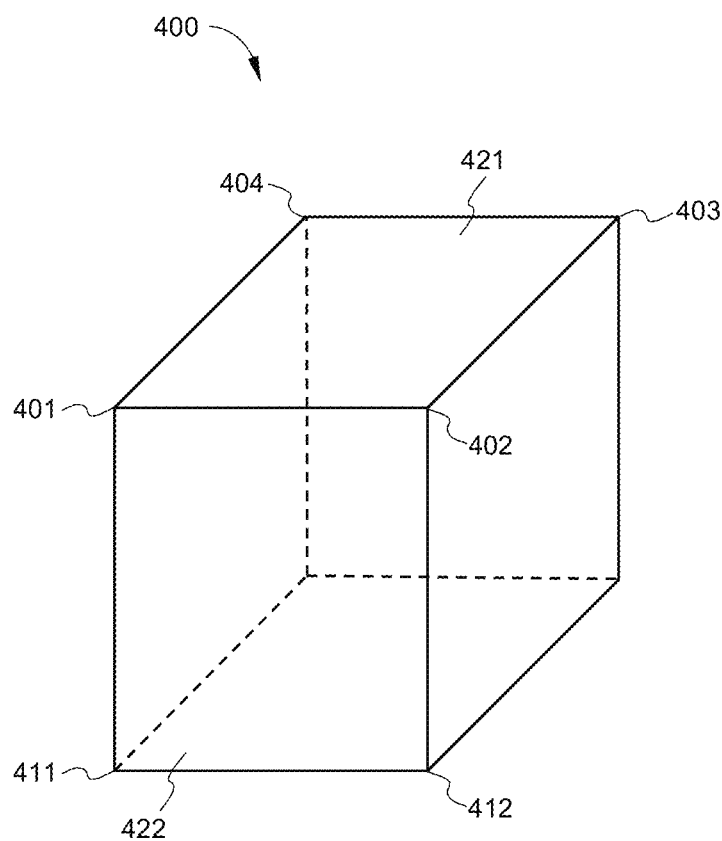
FIG. 4 is a diagram illustrating an example body having boundary representation (B-rep) faces, edges and vertices.

The orientation of each face is important. Normally, a face is surrounded by a set of vertices. Using the right-handed rule, the ordering of these vertices for describing a particular face must guarantee that the normal vector of that face is pointing to the exterior of the solid or body. Normally, the order is counterclockwise. If that face is given by an equation, the equation must be rewritten so that the normal vector at every point on the part that is being used as a face points to the exterior of the solid or body. Therefore, by inspecting normal vectors one can immediately tell the inside and outside of a solid/body under B-rep. This orientation is done for all faces. FIG. 4 shows an example body (i.e., a cube 400) with six B-rep faces. Proper vertices order to describe the top face 421 is vertices/nodes 401, 402, 403, 404, or 402, 403, 404, 401, or 403, 404, 401, 402, or 404, 401, 402, 403. The vertices order for the front face 422 is vertices 411, 412, 402, 401, or 412, 402, 401, 411, or 402, 401, 411, 412, or 401, 411, 412, 402.

In a second embodiment, the disclosed mechanism can perform operations including the following steps:

Step 1: In response to the assignment of a fluid (i.e., liquid or gas) material to a body and a physics condition under "Fluid Flow" 111*b* shown FIG. 1B, the disclosed mechanism invokes a contact detection algorithm to detect or identify contact-pairs/interfaces.

Step 2: The disclosed mechanism classifies each face of the detected or identified contact-pairs (by some proximity parameter) between bodies assigned solid materials and bodies assigned fluid materials into a solid-to-fluid interface type, with a sub-type of non-slip heat conduction (i.e., possible contact type).

Step 3: The disclosed mechanism invokes the tool to show all bodies in the assembly in a GUI. Contact-pairs among the bodies are explicitly presented with markers on the model to facilitate user selection with clear separation of objects of the model in the GUI. For example, markers representing contact-pairs and/or interfaces can be separately selectable from bodies and faces in an MCAD model.

Step 4: The review process can be used to create additional wall types, with sub-types of free-slip or non-slip (i.e., possible contact type).

In a third embodiment, the disclosed mechanism can perform operations including the following steps:

Step 1: In response to the assignment of a fluid (i.e., liquid or gas) material to a body or a physics condition under "Fluid Flow" 111*b*, the disclosed mechanism invokes a contact detection algorithm to detect or identify contact-pairs/interfaces.

Step 2: The disclosed mechanism classifies each face of the detected or identified contact-pairs (by some proximity parameter) between bodies assigned fluid materials as a fluid-to-fluid interface as one of the possible contact types.

Step 3: All faces that are not included in the list of detected contact-pairs are prescribed a default physics condition of "wall"—one sided for bodies assigned fluid materials, or heat transfer convection for bodies assigned solid materials.

In a fourth embodiment, the disclosed mechanism can perform operations including the following steps:

Step 1: In response to the assignment of a fluid (i.e., liquid or gas) material to a body or a physics condition under fluid flow "Fluid Flow" 111*b*, when solid bodies are already included, or in response to the assignment of a solid body or a physics condition under "Solid Thermal" 111*c*, when fluid bodies are already included, the tool invokes a contact detection algorithm to detect or identify contact-pairs and/or interfaces.

Step 2: All faces that are not included in the list of detected contact-pairs as described in the first embodiment, and/or solid-to-fluid interfaces as described in the second embodiment, and/or fluid-to-fluid interfaces as described in the third embodiment, and/or where the user has specifically defined another physics condition, are prescribed a default physics condition of wall—one sided for bodies assigned fluid materials, or heat transfer convection for bodies assigned solid materials.

Step 3: The review process can be used to create different wall sub-types (i.e., possible contact types), such as free-slip or non-slip, or heat transfer types, such as fixed temperature, insulated, heat flux.

In a fifth embodiment, the disclosed mechanism can perform operations including the following steps:

Step 1: In response of the assignment of a solid material to a body or a physics condition under "Solid Thermal" 111*c*, the tool invokes a contact detection algorithm to detect or identify contact-pairs.

Step 2: The tool classifies each face of the detected or identified contact-pairs/interfaces (by some proximity parameter, for example, within certain distance) between bodies assigned solid bodies or solid-thermal physics condition as contact-pairs.

Step 3: All faces that are not included in the list of detected contact-pairs/interfaces are prescribed a default physics condition of heat transfer convection for bodies assigned solid materials.

Figure 5:
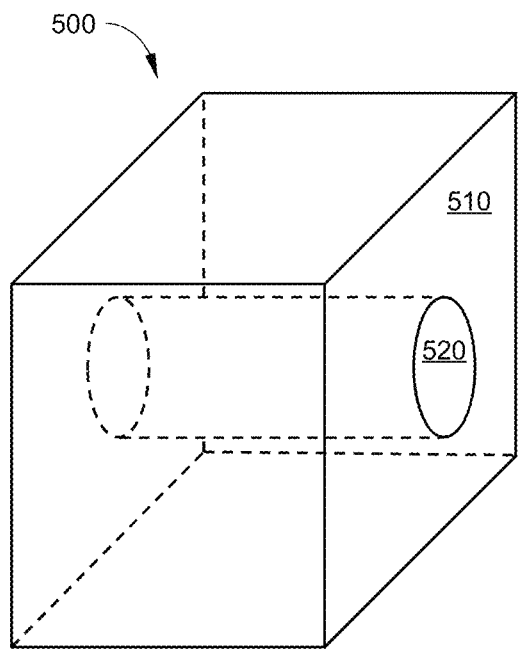
FIG. 5 is a diagram showing an example computerized model containing two bodies, one inside the other sharing a cylindrical face.

An example computerized model 500 containing two different bodies is shown in FIG. 5. The first body 510 is a cube. The second body 520 is a cylinder located inside the first body 510. The interface type is referred to solid-to-none, when the first body 510 is solid and the second body 520 contains nothing (e.g., air). The interface type is referred to as solid-to-fluid or fluid-to-solid, when the first body 510 is solid while the second body 520 is fluid (e.g., water), or vice versa. The interface between solid and fluid can also be defined as a wall.

Used herein, the term "wall" is the boundary to a fluid to prevent it from flowing through. It can be purely marking the boundary of the simulation domain (where it is a frictionless wall), or representing the boundary with a solid body (typically with some surface friction). The solid body may or may not be modelled. When a solid body is modelled and included in a model, the wall becomes an "interface" (e.g., fluid-to-solid, fluid-to-fluid, etc.), at which point either temperature or force may be transmitted in either direction. Interfaces are detected or identified the same manner as contact-pairs and presented as markers (i.e., selectable dots).

Figure 6:
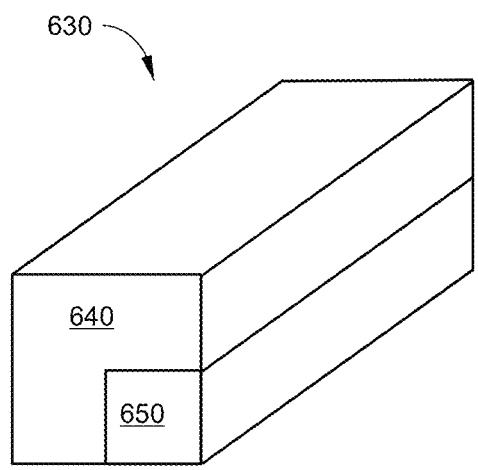
FIG. 6 is a diagram showing another example computerized model containing two bodies sharing two planar faces.

FIG. 6 shows another example computerized model 630 containing two bodies 640-650 that can be either fluid or solid. When temperature is assigned to either or both of the bodies 640-650. Heat transfer can be simulated with this computerized model. The interface or wall between bodies 640-650 can be detected/identified as a contact-pair. In one embodiment, a physics condition is related to temperature is assigned, the physics type for bodies 640-650 in the model 630 may be determined as solid-thermal, when both bodies 640-650 are solids, or, the physics type is determined as fluid-solid heat transfer, when one body 640 is solid and the other body 650 is fluid, or vice versa.

Further, and for simplicity, the physics type of "fluid" is for a fluid body without surrounding boundary defined in a model, for example, fluid in a pipe without the geometry of the pipe explicitly modelled. Similarly, the physics type of "structural" is for a solid body without the surrounding air defined in the model. One example is to model a table on a floor with air surrounding it. Neither the floor nor the surrounding air need be represented by objects in the MCAD model.

Figure 7:
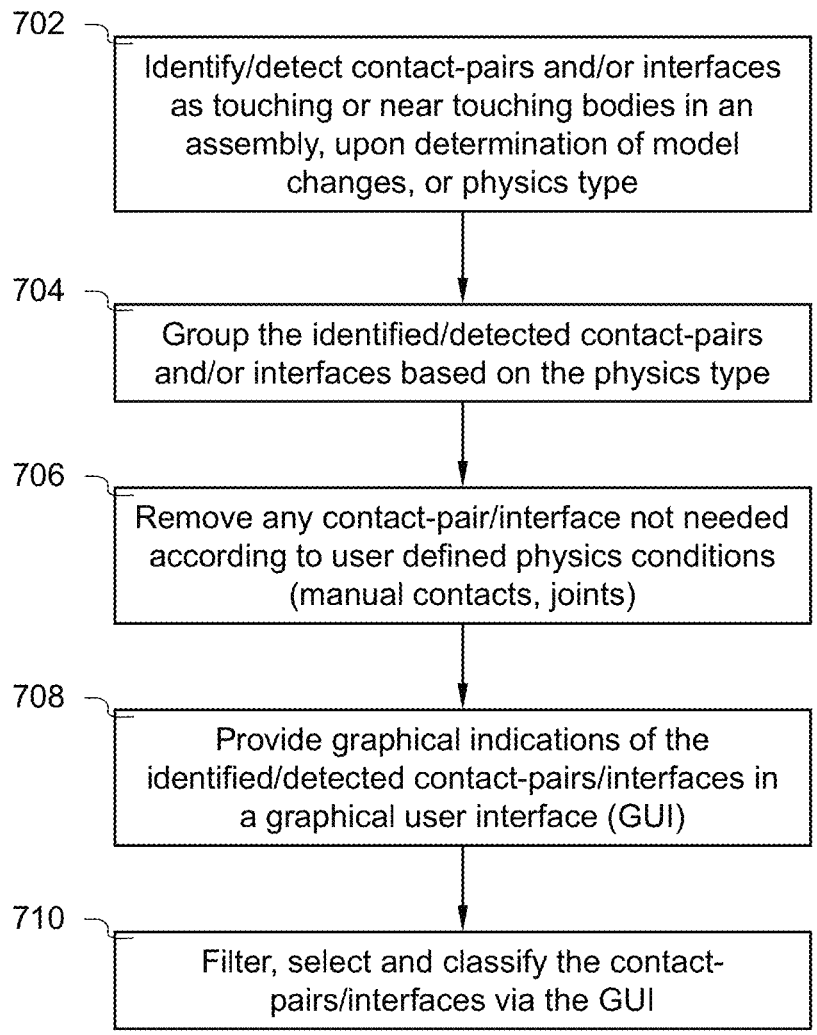
FIG. 7 is a flowchart illustrating an example process of identifying, filtering and classifying contact-pairs in a computerized model.

FIG. 7 shows an example process 700 of identifying, filtering and classifying contact-pairs and/or interfaces of an MCAD assembly in a GUI. Process 700 starts at action 702 by identifying/detecting one or more contact-pairs as touching or near touching bodies in a computerized model (e.g., an MCAD model), upon determination of model changes or physics type (e.g., assigning a physics condition such as displacement, fixed support, force, pressure, temperature, heat source, flow in/out, wall boundary, etc.). Each contact-pair/interface represents two bodies touching each other or two bodies having high likelihood of touching each other. Then, at action 704, the identified/detected contact-pairs/interfaces are grouped together based on the physics type (e.g., structural, fluid, solid-thermal, structural-thermal, fluid-thermal, fluid-solid heat transfer, etc.). Next, at action 706, any contact-pair/interface not needed is removed according to user defined physics conditions (e.g., manual contacts, joints). Each identified/detected contact-pair/interface is shown in a GUI as a marker (e.g., selectable dot) at action 708. In order to manage contact-pairs/interfaces efficiently and effectively, the tool allows simultaneous filtering, selection and classification of contact-pairs via the GUI at action 710. In one example, user selects a contact-pair/interface for review and possible revision by clicking a marker. In another example, a filter containing faces or bodies is established, contact-pairs/interfaces associated with faces/bodies defined in the filter are reviewed and revised. Filtered-out and unconnected contact-pairs/interfaces are faded for easier review. Filtering can be done by faces or by bodies, primary or secondary. Filtering can also be done by selecting one or more markers (i.e., identified/detected contact-pairs/interfaces). Each contact-pair/interface comprises a contact type that can be assigned by the tool as default. Contact-pairs/interfaces can be classified/revised from one contact type to another contact type in response to a user command. Contact-pairs can also be classified as a joint if desired. Markers are logically separated from bodies/faces in the MCAD model. As a result, filtering can be done by bodies or faces, or by markers.

Figure 8A:
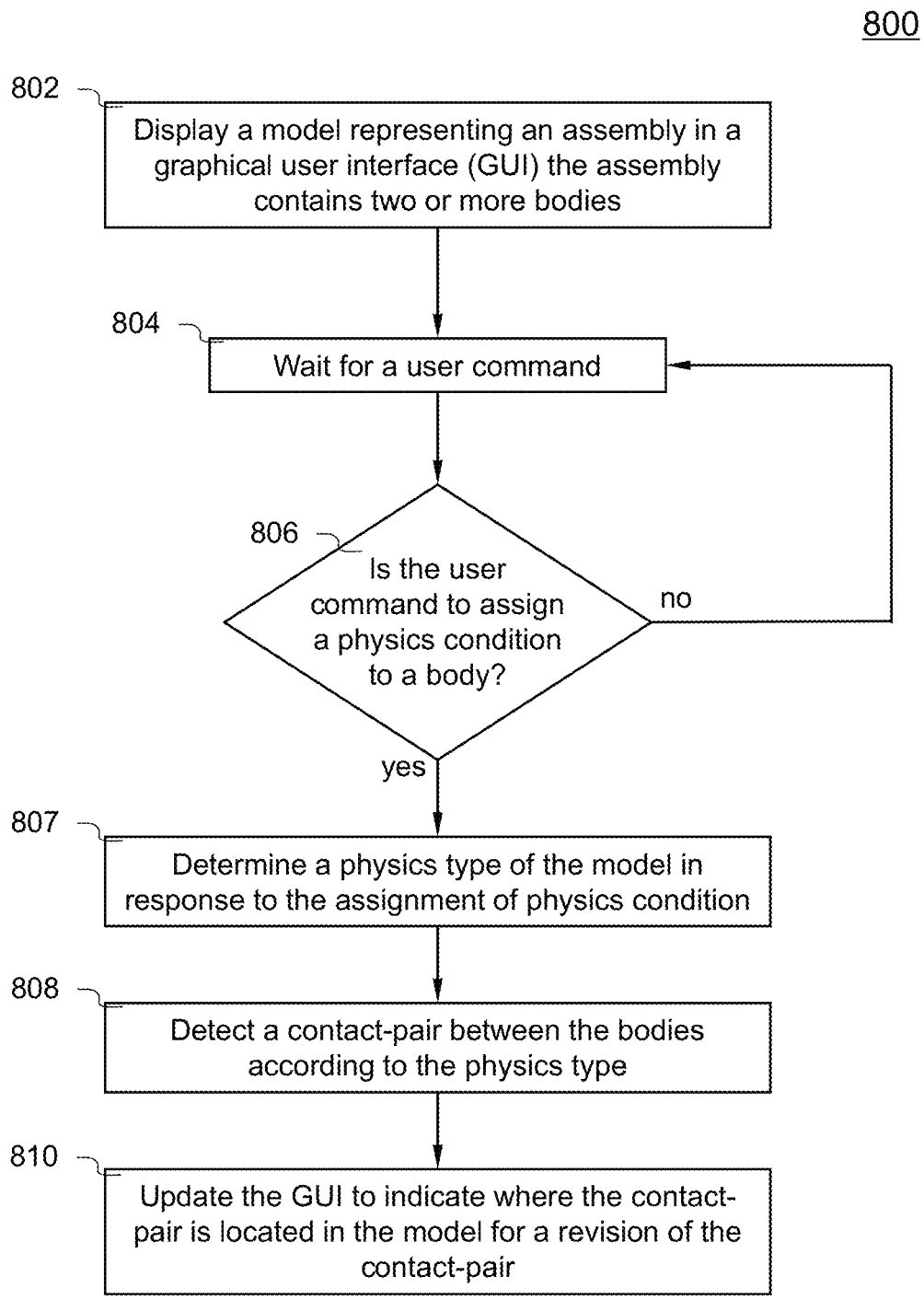
FIGS. 8A-8E collectively is a flowchart showing the logic underlying the derivation and assignment of physics types and logical classification of identified contact-pairs in a computerized model.

The process 800 of the logic underlying the derivation and assignment of physics types and logical classification of identified contact pairs is shown in FIG. 8A. Process 800 starts at action 802 by displaying a model representing an assembly in a GUI upon receipt of a model. The model can be an MCAD model. The assembly can have more than one body, for example, boundary representation (B-rep) bodies. GUI may be shown in many devices including, but not limited to, a monitor connected to a computer either remotely or locally, a screen of a mobile device (e.g., mobile phone, tablet, etc.). In order to have a contact-pair/interface, there are at least two B-rep bodies in the assembly.

Then, process 800 waits for a user command (i.e., idling) at action 804. Next, at decision 806, it is determined whether the received user command is to assign a physics condition (e.g., boundary condition, load case, feature) to one of the bodies in the assembly. The physics condition can be, but is not limited to, "Structural", "Fluid Flow", "Solid Thermal" conditions.

When decision 806 is false, process 800 follows the 'no' branch back to action 804 until the decision 806 becomes true. Process 800 then follows the 'yes' branch to action 807. In response to the assignment of the physics condition, a physics type of the model for a simulation can be determined. Physics type of the model can include the following types, for example, "structural", "fluid", "structural-thermal", "solid-thermal", "fluid-thermal", "FSI", "CHT", "FSI plus CHT", etc. FIGS. 8B-8E show example processes 820, 840, 860 of determining/setting physics type of the model in response to an assignment of a physics condition to a body. Term 'process' used herein is also referred to as a configured logic. The configured logic is a sequence of logics as actions and decisions for determining certain outcomes from one or more inputs.

Next, at action 808, contact-pairs and/or interfaces are detected/identified between bodies in the assembly according to the determined physics type. For example, a contact-pair is between two solid bodies, while an interface is between a solid body and a fluid body, or between two fluid bodies. After the contact-pairs and/or interfaces have been detected/identified, at action 810, the GUI is updated to indicate where each contact-pair is located in the model for possible revision.

In one embodiment, markers (e.g., selectable dots) are shown at corresponding locations of respective contact-pairs/interfaces on the model. Only contact-pairs/interfaces specified in a filtering mechanism are shown for user review and revision. Each marker represents a contact-pair/interface indicating a contact or a potential contact between two bodies/faces according to the determined physics type. Markers are logically separated from the B-rep faces/bodies. The filtering mechanism can include all bodies in the assembly as default. The filtering mechanism allows selection by B-rep faces, B-rep bodies, or markers.

Figure 8B:
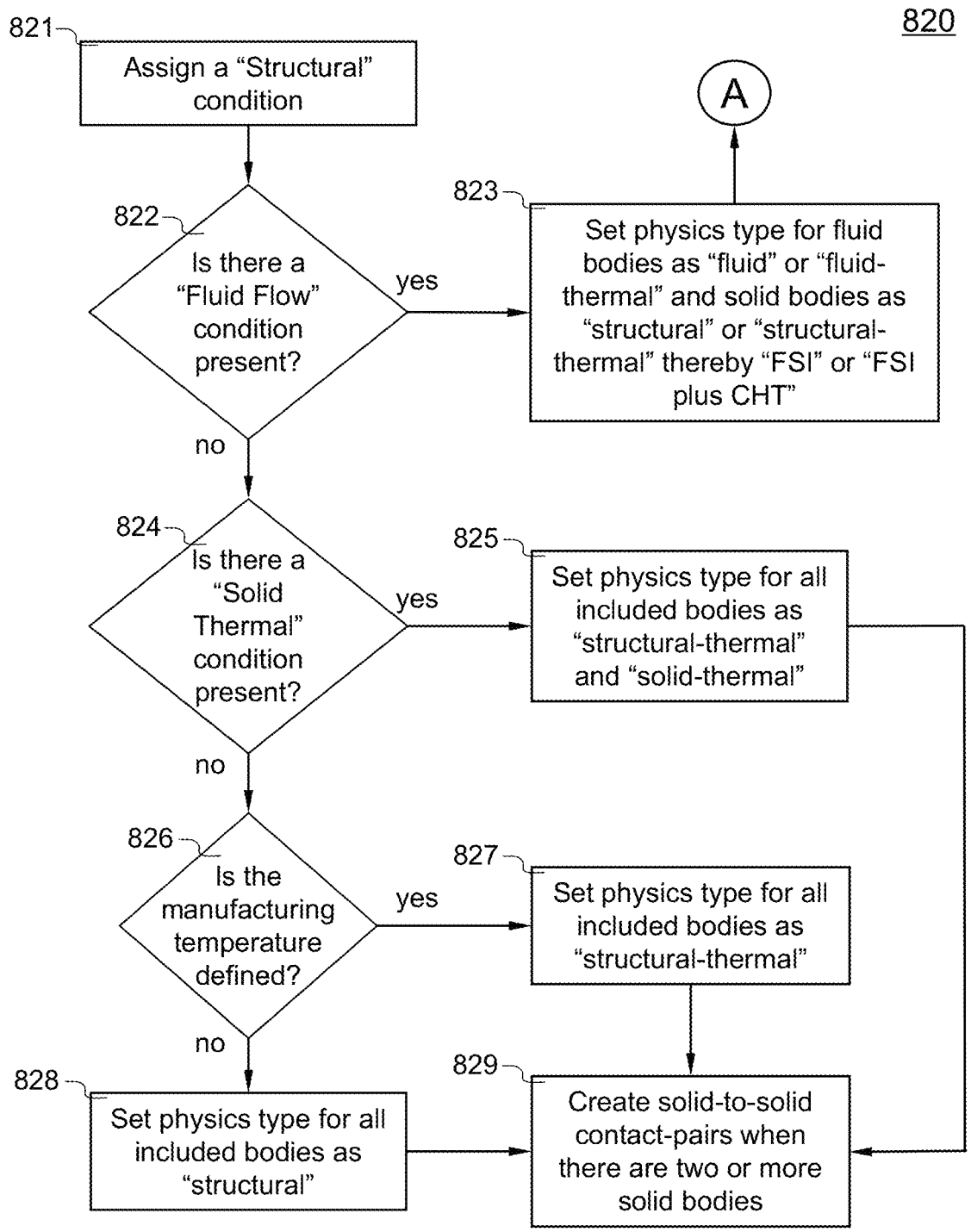

FIG. 8B is a flowchart showing an example process (i.e., a configured logic) 820 of determining/setting physics type in response to user command, of assigning a "Structural" condition at action 821 to some of the bodies in the assembly. "Structural" condition 111a can contain various choices, for example, the choices 112a-112j shown in FIG. 1B. Next, at decision 822, it is determined whether there is a "Fluid Flow" condition present in the model. If true, process 820 follows the 'yes' branch to action 823 to set the physics type for fluid bodies as "fluid" or "fluid-thermal" and all solid bodies as "structural" or "structural-thermal" thereby "FSI" or "FSI plus CHT", respectively. Process 820 continues to action 871 shown in FIG. 8E for creating fluid-to-solid interfaces, then to action 872 for creating solid-to-solid contact-pairs if there are two or more solid bodies, and finally to action 873 for creating fluid-to-fluid interfaces when there are two or more fluid bodies in the model.

If the decision 822 is not true, process 820 follows the 'no' branch to another decision 824. It is determined whether there is a "Solid Thermal" condition present in the model. If true, process 820 sets the physics type for all included bodies as "structural-thermal" and "solid-thermal" at action 825. Solid-to-solid contact-pairs are then created at action 829 when there are more than one solid bodies in the model.

If the decision 824 is not true, process 820 follows the 'no' branch to yet another decision 826. It is determined whether there is a manufacturing temperature (i.e., property of a body) defined. If true, physics type is set as "structural-thermal" at action 827, and solid-to-solid contact pairs are created at action 829 when there are more than one solid bodies in the model. Otherwise, process 820 follows the 'no' branch to action 828. Physics type is set as "structural", and solid-to-solid contact pairs are created at action 829 when there are more than one solid bodies in the model.

Figure 8C:
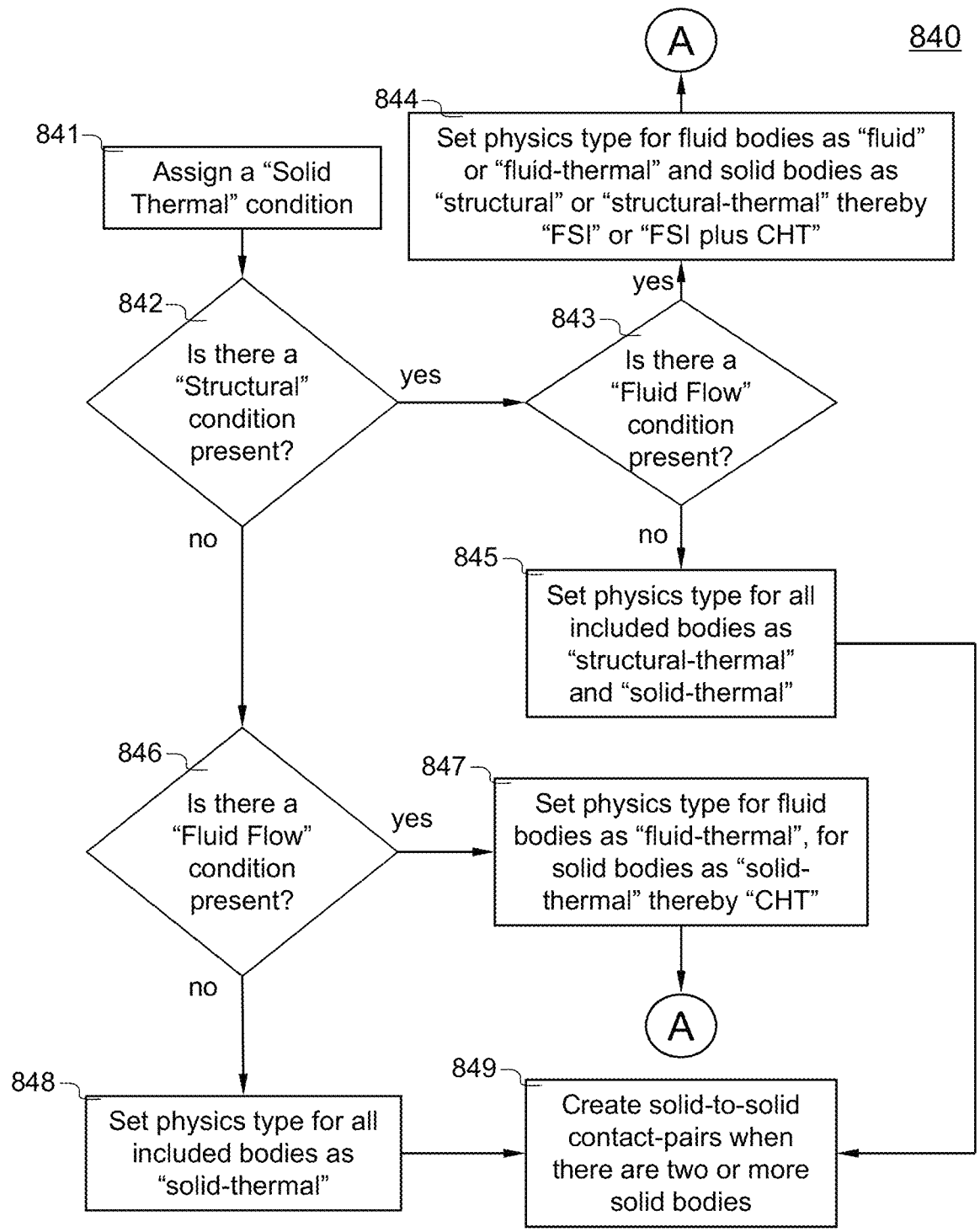

FIG. 8C is a flowchart showing an example process (i.e., a configured logic) 840 of determining/setting physics type in response to user command of assigning a "Solid Thermal" condition to a body in the model at action 841. Next, at decision 842, it is determined whether there is a "Structural" condition present in the model. If true, process 840 follows the 'yes' branch to decision 843. It is determined whether there is a "Fluid Flow" condition present in the model. If the decision 843 is true, process 840 sets the physics type for fluid bodies as "fluid" or "fluid-thermal" and all solid bodies as "structural" or "structural-thermal" thereby "FSI" or "FSI plus CHT", respectively at action 844, and process 840 continues to actions 871, 872 and 873 to create contact-pairs and/or interfaces. If the decision 843 is not true, process 840 sets the physics type as "structural-thermal" and "solid-thermal" at action 845. Next, at action 849, solid-to-solid contact-pairs are created when there are two or more solid bodies in the model.

If the decision 842 is not true, process 840 moves to decision 846. It is determined whether there is a "Fluid Flow" condition present in the model. If the decision 846 is not true, physics type is set as 'solid-thermal" at action 848, and solid-to-solid contact-pairs are created when there are two or more solid bodies in the model at action 849. If the decision 846 is true, then, at action 847, the physics type is set as "fluid-thermal" for fluid bodies and "solid-thermal" for solid bodies, i.e., the physics type is "fluid-solid heat transfer" or CHT. Process 840 continues to actions 871, 872 and 873 to create contact-pairs and/or interfaces.

Figure 8D:
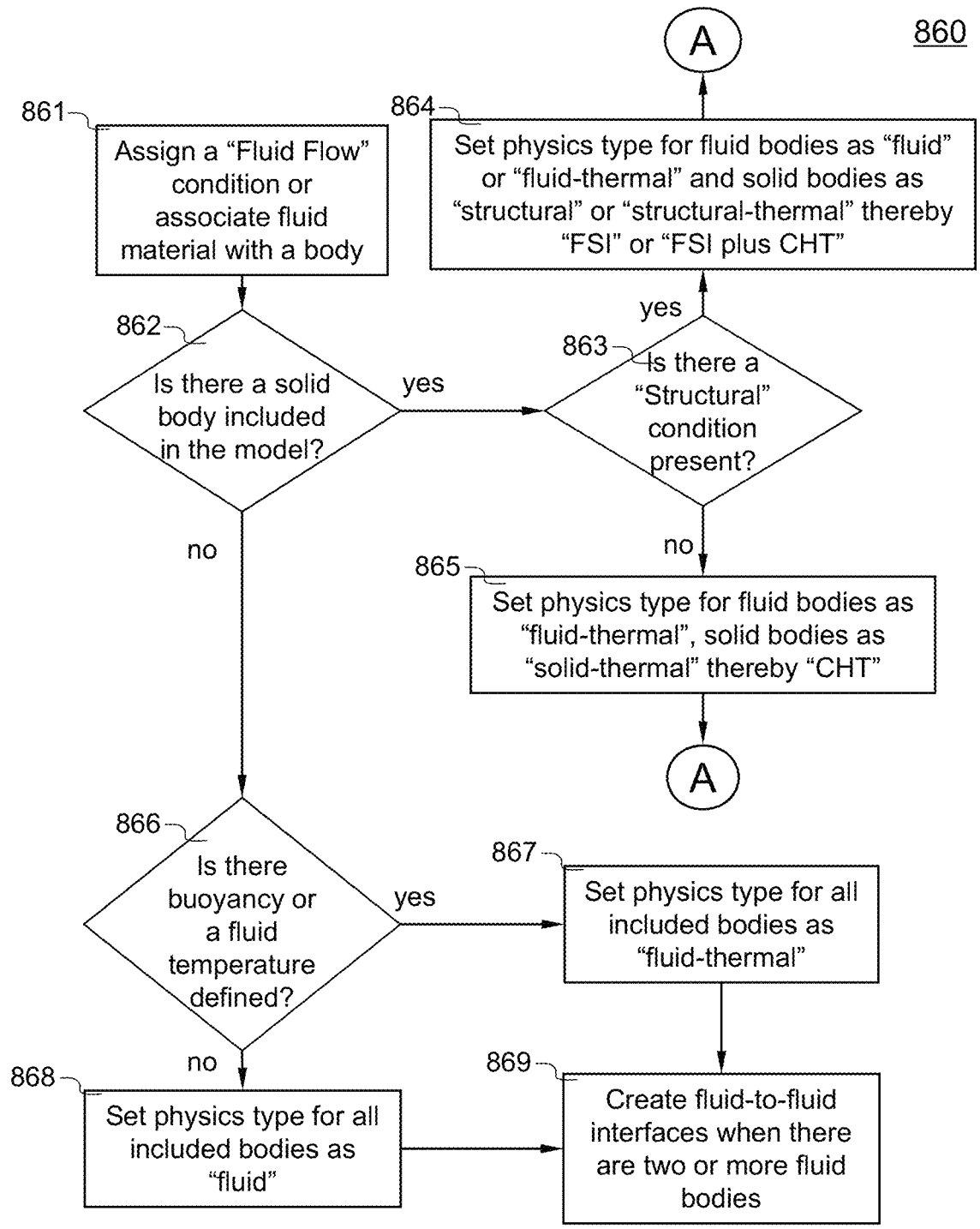
Figure 8E:
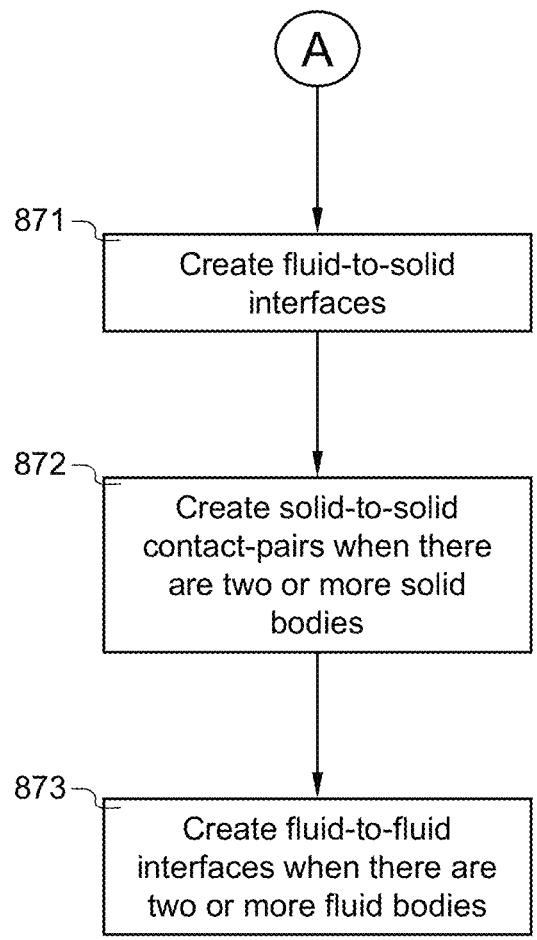

FIG. 8D is a flowchart showing an example process 860 (i.e., a configured logic) of determining/setting physics type in response to user command of assigning a "Fluid Flow" condition to a body, or associating fluid material with a body at action 861. Next, at decision 862, it is determined whether there is a solid body included in the model. If true, process 860 follows the 'yes' branch to decision 863. It is determined whether there is a 'Structural" condition present in the model. If the decision 863 is true, physics type is set for fluid bodies as "fluid" or "fluid-thermal" and all solid bodies as "structural" or "structural-thermal" thereby "FSI" or "FSI plus CHT", respectively at action 864. Process 860 continues to actions 871, 872 and 873 to create contact-pairs and/or interfaces (FIG. 8E). Otherwise, if the decision 863 is not true, the physics type is set as "fluid-thermal" for fluid bodies and "solid-thermal" for solid bodies, i.e., the physics type is "fluid-solid heat transfer" at action 865. Process 860 continues to actions 871, 872 and 873 to create contact-pairs and/or interfaces.

If the decision 862 is not true, process 860 moves to decision 866. It is determined whether there is buoyancy or fluid temperature defined in the model. Buoyancy is a property of the simulation. Fluid temperature is a property of a "Fluid flow" condition. If the decision 866 is true, the physics type is set as "fluid-thermal" at action 867. Otherwise, the physics type is set as "fluid" for all included bodies at action 868. Then, process 860 continues to action 869 to create fluid-to-fluid interfaces when there are more than one fluid bodies in the model for both branches of decision 866.

The subject matter described herein may be implemented using any suitable processing system with any suitable combination of hardware, software and/or firmware, such as described below with reference to the non-limiting examples shown in FIGS. 9A-9C.

FIG. 9A depicts an example system 900 that includes a standalone computer architecture where a processing system 902 (e.g., one or more computer processors) includes a module 904 (e.g., software module stored in memory) being executed on it. The processing system 902 has access to a non-transitory computer-readable memory 906 in addition to one or more data stores 908. The one or more data stores 908 may contain first data 910 as well as second data 912.

FIG. 9B depicts another example system 920 that includes a client-server architecture. One or more clients 922 (e.g., user personal computer, workstation, etc.) accesses one or more servers 924 executing computer instructions of a module 926 (e.g., software module stored in memory) on a processing system 927 via one or more networks 928. The one or more servers 924 may access a non-transitory computer readable memory 930 as well as one or more data stores 932. The one or more data stores 932 may contain first data 934 as well as second data 936.

Figure 9C:
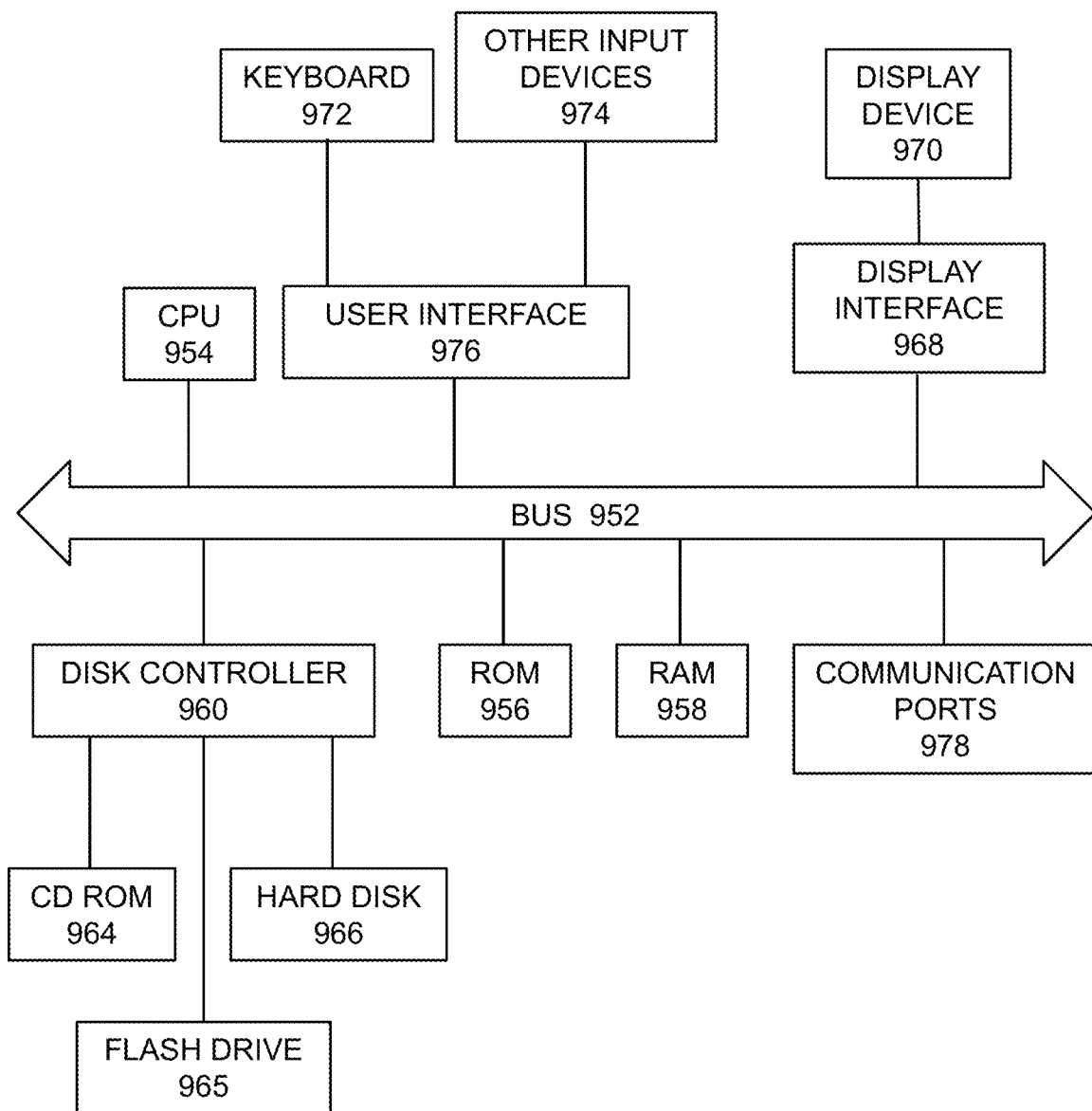
FIG. 9C is a function block diagram showing salient components of an example computing device for implementing the subject matters described herein.

FIG. 9C shows a function block diagram of example hardware for a standalone computer architecture 950, such as the architecture depicted in FIG. 9A, that may be used to contain and/or implement the subject matter described herein. A bus 952 may serve as the information highway interconnecting the other illustrated components of the hardware. A processing system 954 labeled CPU (central processing unit) (e.g., one or more computer processors), may perform calculations and logic operations required to execute a program/software/module. A non-transitory computer-readable storage medium, such as read only memory (ROM) 956 and random access memory (RAM) 958, may be in communication with the processing system 954 and may contain one or more programming instructions. Optionally, program instructions may be stored on a non-transitory computer-readable storage medium such as a magnetic disk, optical disk, recordable memory device, flash memory, or other physical storage medium. Computer instructions may also be communicated via a communications signal, or a modulated carrier wave, e.g., such that the instructions may then be stored on a non-transitory computer-readable storage medium thru communication port 978.

A disk controller 960 interfaces one or more optional disk drives to the system bus 952. These disk drives may be external or internal flash memory drives 965, external or internal CD-ROM, CD-R, CD-RW or DVD drives 964, or external or internal hard disk drives 966. As indicated previously, these various disk drives and disk controllers are optional devices.

If needed, the processor 954 may access each of the following components: real-time data buffer, conveyors, file input processor, database index shared access memory loader, reference data buffer and data managers. Each component may include a software application stored in one or more of the disk drives connected to the disk controller 960, the ROM 956 and/or the RAM 958.

A display interface 968 may permit information from the bus 952 to be displayed on a display 970 in audio, video, graphical, text, or alphanumeric format.

In addition to the standard computer-type components, the hardware may also include data input devices, such as a keyboard 972, or other input device 974, such as a microphone, remote control, pointer, mouse, touch screen, and/or joystick.

This written description describes example embodiments of the subject matter, but other variations fall within scope of the disclosure. For example, the systems and methods may include and utilize data signals conveyed via networks (e.g., local area network, wide area network, internet, combinations thereof, etc.), fiber optic medium, carrier waves, wireless networks, etc. for communication with one or more data processing devices. The data signals can carry any or all of the data disclosed herein that is provided to or from a device.

The methods and systems described herein may be implemented on many different types of processing devices by program code comprising program instructions that are executable by the device processing system. The software program instructions may include source code, object code, machine code, or any other stored data that is operable to cause a processing system to perform the methods and operations described herein. Any suitable computer languages may be used such as C, C++, Java, etc., as will be appreciated by those skilled in the art. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other non-transitory computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive or" may be used to indicate situation where only the disjunctive meaning may apply.

Additionally, used herein, the terms "top", "bottom", "front", "back", "higher", "lower", "outer", and "inner" are intended to provide relative positions/locations for the purposes of description, and are not intended to designate an absolute frame of reference. Further, the order of blocks in process flowcharts or diagrams do not inherently indicate any particular order nor imply any limitations.

Although the subject matter has been described with reference to specific embodiments thereof, these embodiments are merely illustrative, and not restrictive of, the invention. Various modifications or changes to the specifically disclosed example embodiments will be suggested to persons skilled in the art. Whereas example physics types have been shown and described, other types may be used for achieving the same. Furthermore, whereas some examples have been shown and described using two bodies/components with simple shapes, any shapes with various complicities can be used for achieving the same. In summary, the scope of the subject matter should not be restricted to the specific example embodiments disclosed herein, and all modifications that are readily suggested to those of ordinary skill in the art should be included within the spirit and purview of this application and scope of the appended claims.

What is claimed is:

1. A computer-implemented method comprising:
displaying a model representing an assembly to a user in a graphical user interface (GUI), the assembly having a first body and a second body;
receiving an assignment of a physics condition to the first body and/or the second body as input from the user, and determining a physics type of the first body and/or the second body in response to the assignment of a physics condition;
detecting one or more potential contact-pairs between the first body and the second body according to the determined physics type;
for each of the one or more potential contact-pairs, automatically creating a default contact-pair between the first body and the second body based on that potential contact-pair, wherein the default contact-pair is associated with a default contact type;
updating the GUI to indicate where each default contact-pair is located in the model with a visual marker, wherein the visual marker for each default contact-pair is configured to be selectable by the user to review that default contact-pair;
providing a contact review pane via the GUI that comprises:
a summary of all remaining default contact-pairs still associated with the model;
a first interface element configured to be selectable by the user to convert a selected default contact-pair into a confirmed contact-pair having a same contact type as the default contact type;
a second interface element configured be selectable by the user to convert the selected default contact-pair into an overridden contact-pair having a different contact type from the default contact type; and
a third interface element configured to be selectable by the user to remove the selected default contact-pair from the model.

2. The method of claim 1, wherein the physics condition is assigned to a portion of the first body and/or the second body, the method further comprising: presenting a set of user interface elements in the GUI, the set of user interface elements respectively indicating separate possible physics conditions for the portion of the first body and/or the second body, wherein the physics condition is assigned via a selection of the set of user interface elements.

3. The method of claim 2, wherein the physics condition indicates a boundary condition applied to the portion of the first body and/or the second body.

4. The method of claim 1, wherein the physics condition belongs to a set of possible physics conditions comprising three or more of support, force, pressure, displacement, moment, mass, bearing load, bolt preload, contact, and joint, wherein the physics type belongs to a set of possible physics types, wherein the set of possible physics conditions and the set of possible physics types are related according to a configured logic, and wherein the determination of the physics type is based on the configured logic.

5. The method of claim 4, wherein the set of possible physics types include a structural type, wherein the set of possible physics conditions include a support condition or a force condition, and wherein the support condition or the force condition is associated with the structural type according to the configured logic.

6. The method of claim 1, wherein the contact review pane is provided in response to the user selecting any visual marker to review the associated default contact-pair.

7. The method of claim 1, wherein the detecting the one or more potential contact-pairs further comprises: determining whether the first body and the second body are located within a predefined proximity.

8. The method of claim 1, further comprising: receiving a user selection of the first body and/or the second body via the GUI.

9. The method of claim 8, wherein the first body includes a face, the method further comprising:
- identifying one or more default contact-pairs associated with the face of the first body; and
- updating the GUI to:
    - indicate the visual marker for the identified one or more default contact-pairs associated with the face of the first body; and
    - omit the visual marker for any default contact-pairs not associated with the face of the first body.

10. The method of claim 1, wherein the default contact type is a permanently bonded contact type and the different contact type is a sliding contact type.

* * * * *